(12) United States Patent
Suzuki

(10) Patent No.: US 12,550,472 B2
(45) Date of Patent: Feb. 10, 2026

(54) IMAGE CAPTURING DEVICE AND IMAGE CAPTURING APPARATUS

(71) Applicant: NIKON CORPORATION, Tokyo (JP)

(72) Inventor: Satoshi Suzuki, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 900 days.

(21) Appl. No.: 17/765,160

(22) PCT Filed: Sep. 30, 2020

(86) PCT No.: PCT/JP2020/037301
§ 371 (c)(1),
(2) Date: Mar. 30, 2022

(87) PCT Pub. No.: WO2021/066069
PCT Pub. Date: Apr. 8, 2021

(65) Prior Publication Data
US 2022/0344400 A1 Oct. 27, 2022

(30) Foreign Application Priority Data

Sep. 30, 2019 (JP) .................................. 2019-180979

(51) Int. Cl.
*H01L 23/34* (2006.01)
*H01L 23/367* (2006.01)
*H10F 39/00* (2025.01)

(52) U.S. Cl.
CPC .......... *H10F 39/811* (2025.01); *H01L 23/367* (2013.01)

(58) Field of Classification Search
None
See application file for complete search history.

(56) References Cited

U.S. PATENT DOCUMENTS

| 2015/0181698 A1* | 6/2015 | Suganuma ............ H10F 39/811 174/254 |
| 2017/0104019 A1 | 4/2017 | Jung |
| 2020/0258924 A1* | 8/2020 | Takachi ................ H10F 39/199 |

FOREIGN PATENT DOCUMENTS

| CN | 107017270 A | 8/2017 |
| JP | 2006-128196 A | 5/2006 |
| JP | 2015-128187 A | 7/2015 |
| JP | 2018-166207 A | 10/2018 |
| WO | 2018/186195 A1 | 10/2018 |

(Continued)

OTHER PUBLICATIONS

May 9, 2023 Office Action issued in Japanese Patent Application No. 2021-551420.

(Continued)

*Primary Examiner* — Bradley Smith
(74) *Attorney, Agent, or Firm* — Oliff PLC

(57) ABSTRACT

An image capturing device includes: a first layer, including a photoelectric converting unit configured to photoelectrically convert light and produce electric charges; a second layer, stacked with the first layer, including a first circuit configured to process a signal based on electric charges produced by the photoelectric converting unit; and a third layer, stacked with the second layer, including an insulating layer provided between a second circuit for processing a signal processed by the first circuit and the second layer, and a heat conduction layer with higher heat conductivity than the insulating layer provided in the insulating layer.

20 Claims, 16 Drawing Sheets

(56) References Cited

FOREIGN PATENT DOCUMENTS

| WO | 201978291 | A1 | 4/2019 |
|---|---|---|---|
| WO | 201987764 | A1 | 5/2019 |

OTHER PUBLICATIONS

Mar. 29, 2025 Office Action issued in Chinese Patent Application No. 202080068179.8.
Jan. 28, 2025 Office Action issued in Japanese Patent Application No. 2023-190036.
Aug. 12, 2025 Office Action issued in Japanese Patent Application No. 2023-190036.
Nov. 29, 2025 Office Action issued in Chinese Patent Application No. 202080068179.8.

* cited by examiner

IMAGE CAPTURING DEVICE AND IMAGE CAPTURING APPARATUS

CROSS-REFERENCE TO RELATED APPLICATIONS

This application is a National Stage Entry of International Application No. PCT/JP2020/037301 filed on Sep. 30, 2020, which claims priority to Japanese Patent Application No. 2019-180979 filed on Sep. 30, 2019, the contents of each of which are hereby incorporated by reference in their entirety.

BACKGROUND

1. Technical Field

The present invention relates to an image capturing device and an image capturing apparatus.

2 Related Art

A configuration is known, where a layer with a plurality of pixels, having a photoelectric converting unit, arranged thereon, and a layer with a signal processing circuit provided thereon are stacked in an image capturing device (for example, refer to Patent Document 1).
Patent Document 1: Japanese Patent Application Publication No. 2015-128187

In the above-described image capturing device, heat is generated in the signal processing circuit due to the processing of signals output from the pixels.

GENERAL DISCLOSURE

In a first aspect of the present invention, provided is an image capturing device, including: a first layer, including a photoelectric converting unit configured to photoelectrically convert light and produce electric charges; a second layer, stacked with the first layer, including a first circuit configured to process a signal based on electric charges produced by the photoelectric converting unit; and a third layer, stacked with the second layer, including an insulating layer provided between a second circuit for processing a signal processed by the first circuit and the second layer, and a heat conduction layer with higher heat conductivity than the insulating layer provided in the insulating layer.

A second aspect of the present invention provides an image capturing apparatus including the image capturing device of the first aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims. And all the combinations of the features described in the embodiment(s) are not necessarily essential to means provided by aspects of the invention.

Figure 1:
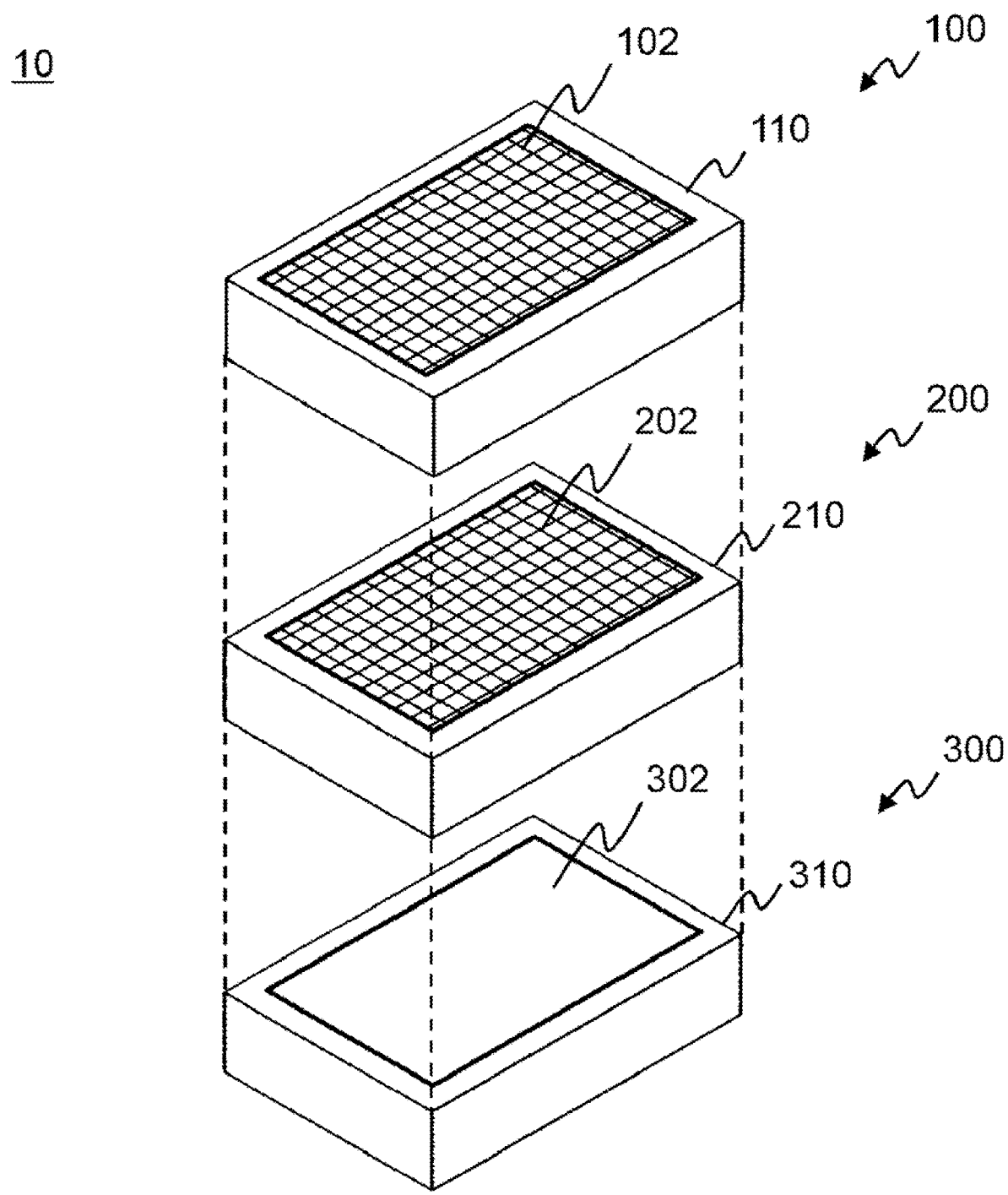
FIG. 1 illustrates a schematic view of an image capturing device 10 according to the present embodiment.

FIG. 1 illustrates a schematic view of an image capturing device 10 according to the present embodiment. The image capturing device 10 produces image data based on incident light from a subject. The image capturing device 10 is in a stacked structure wherein a first layer 100, a second layer 200 and a third layer 300 are stacked. It should be noted that FIG. 1 schematically illustrates a position relationship between each layer and a process of each layer in the image capturing device 10. Some members included in each layer, for example, a wiring layer for bonding the layers to each other, wiring provided in the wiring layer and so on are described with reference to the cross-sectional view of the image capturing device 10 and so on shown in FIG. 2, and are omitted for simplicity in FIG. 1.

The first layer 100 includes pixels that outputs a signal produced based on incident light. The plurality of pixels are provided in the first layer 100, arranged along a matrix direction. Each pixel includes a photoelectric converting unit 102, a transmission unit, a floating diffusion (FD), a reset unit and an output unit described below. It should be noted that the pixel may be configured by a plurality of photoelectric converting units sharing an FD, a reset unit, and an output unit.

The photoelectric converting unit 102 photoelectrically converts incident light to produce electric charges. The photoelectric converting unit 102 is a photoelectric converter such as a photodiode, for example. A plurality of photoelectric converting units 102 are provided in the first substrate 110, and arranged along the matrix direction.

The transmission unit is configured by a transfer transistor and transfers electric charges photoelectrically converted by the photoelectric converting unit 102 to the FD. The FD accumulates (holds) electric charges transferred to the FD and converts the electric charges to a voltage divided by a capacitance value. The FD is an accumulation unit, and accumulates electric charges produced by the photoelectric converting unit 102. The output unit includes an amplification unit and a selection unit.

The amplification unit is configured by an amplification transistor having a gate (terminal) connected to the FD, and outputs a signal of electric charges accumulated in the FD. The drain (terminal) of the amplification transistor is supplied with the power voltage. The source (terminal) of the amplification transistor is connected to the signal line via the selection unit. The amplification transistor functions as a part of a source follower circuit. The amplification unit and selection unit constitute the output unit that produces and outputs a signal based on the electric charges generated by the photoelectric converting unit 102.

The reset unit is configured by a reset transistor, and electrically connects or disconnects the FD from the power voltage. The reset unit resets the electric charges accumulated in the FD. The reset unit ejects the electric charges accumulated in the FD and resets the voltage of the FD.

The selection unit is configured by a selection transistor, and electrically connects or disconnects the amplification unit from the signal line. The selection transistor outputs the signal from the amplification unit to the signal line in an on state. It should be noted that the transfer transistor, the amplification transistor, the selection transistor and the reset transistor are included in a transistor 105 described below.

The second layer 200 includes a signal processing unit for processing a signal output from the pixels provided in the first layer 100 and a control unit for controlling the pixels. The second layer 200 includes a plurality of signal processing circuits 202 provided in the second substrate 210 as the signal processing unit. The signal processing circuit 202 is one example of a first circuit. Also, the second layer 200 includes a plurality of control circuits provided in the second substrate 210 as the control unit. The signal processing circuit 202 and the control circuit are provided in each photoelectric converting unit 102. It should be noted that the signal processing circuit 202 and the control circuit may also be provided in each of the plurality of photoelectric converting units 102.

The signal processing circuit 202 of the present example includes an AD converting unit or the like. Each of the AD converting unit included in the signal processing circuit 202 converts an analog signal output from pixels to a digital signal. The signal processing circuit 202 outputs the converted digital signal. The control circuit controls the photoelectric converting unit 102 to start and end receiving light by controlling the pixels (the transmission unit, the reset unit and the selection unit).

The third layer 300 includes an image processing unit for processing the signal output from the signal processing circuit provided in the second layer 200. The third layer 300 includes an image processing circuit 302 provided in the third substrate 310 as the image processing unit. The image processing circuit 302 is one example of the second circuit. One image processing circuit 302 of the present example is provided in each of the plurality of signal processing circuits 202 and the control circuits, and respectively connected to the signal processing circuits 202 and the control circuits. The image processing circuit 302 processes the signal output from the signal processing circuit 202 and produces a signal or image data to control the pixels (the transmission unit, the reset unit and the selection unit). The signal to control the pixels produced by the image processing circuit 302 are transmitted to the control circuit of the second layer 200. The image data or the like produced by the image processing circuit 302 is transmitted to the first layer 100, and output to the exterior of the image capturing device 10 from the first layer 100 or the third layer 300. It should be noted that the image processing circuit 302 may be provided in each one of the signal processing circuits 202 and the control circuits.

Figure 2:
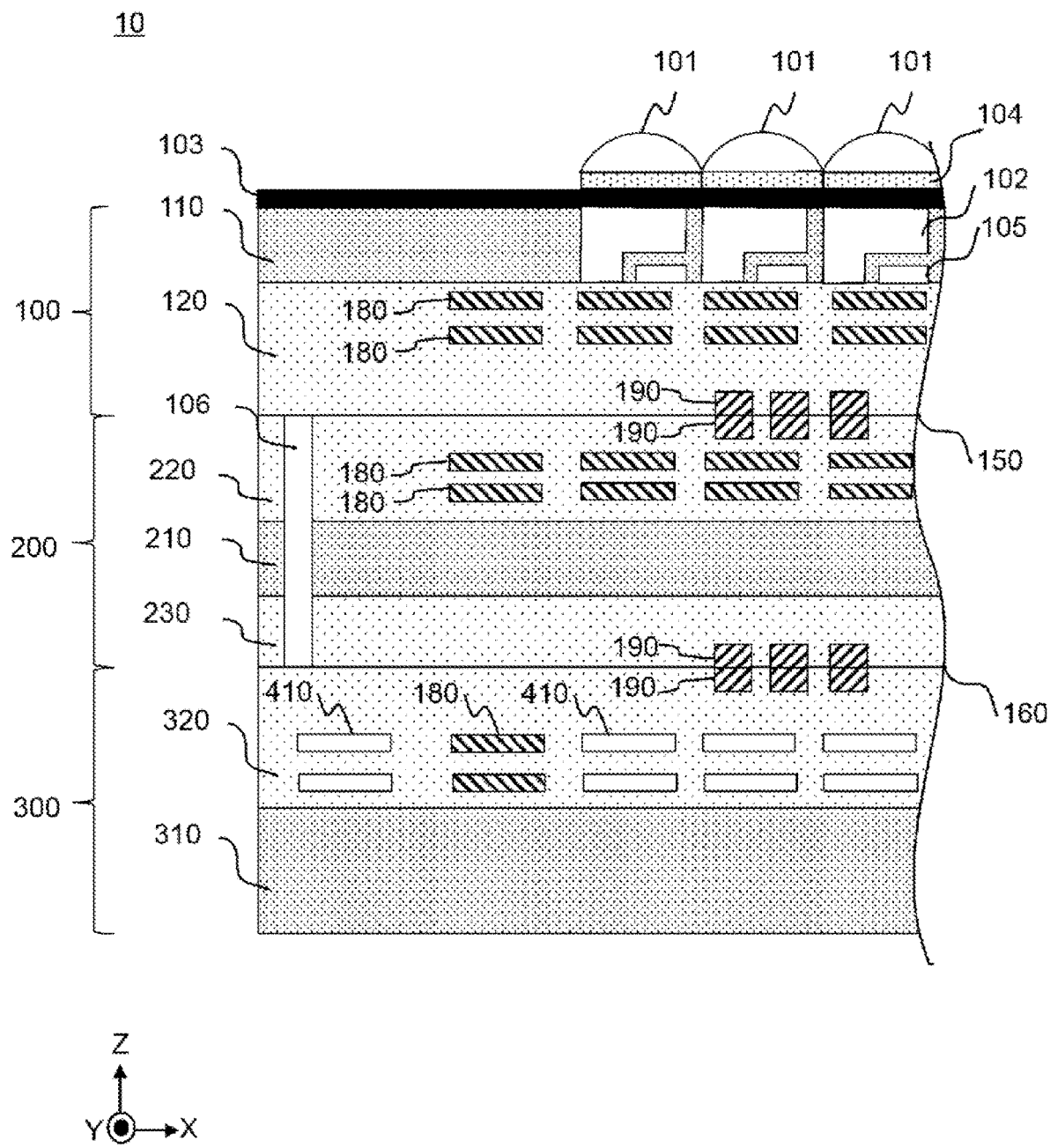
FIG. 2 illustrates one example of a cross-sectional view in an X-Z direction of the image capturing device 10 according to the present embodiment.

FIG. 2 illustrates one example of the cross-sectional view in the X-Z direction of the image capturing device 10 according to the present embodiment. Although in the present example, a backside irradiation-type image capturing device 10 is illustrated, the image capturing device 10 is not limited to the backside irradiation-type. The image capturing device 10 of the present example includes a first layer 100, a second layer 200 and a third layer 300. It should be noted that the light from the subject enters in the direction indicated by the white arrow (in the figure, in the negative direction of the Z axis) as illustrated. In the present embodiment, the surface on the side of the first layer 100 on which light enters (the positive side of the Z axis in the figure) may be referred to as the front surface, and the surface on the opposite side (the negative side of the Z axis in the figure) may be referred to as the back surface.

The X axis and the Y axis are orthogonal with each other, and the Z axis is orthogonal with the X-Y surface. It should be noted that the direction parallel to the Z axis may be referred to as a stack direction of the image capturing device 10. The terms "upper" and "lower" are not limited to the vertical direction in the direction of gravity. These terms refer to directions relative to the Z axis.

One example of the first layer 100 is a CMOS image sensor of a backside irradiation-type. The first layer 100 includes a first substrate 110 and a first wiring layer 120. The first substrate 110 is provided on the positive side of the Z axis than the first wiring layer 120. The first substrate 110 is arranged two-dimensionally, and includes a plurality of photoelectric converting units 102 for accumulating the electric charges based on the incident light and a plurality of transistors 105.

A plurality of color filters 104 are provided via a passivation film 103 on the positive side of the Z axis than the first substrate 110. The color filter 104 is an optical filter that transmits light in a specific wavelength region. The plurality of color filters 104 transmit light in different wavelength regions to each other and are provided in a specific matrix (for example, a Bayer array).

A microlens 101 is provided on the positive side of the Z axis than the color filter 104. The microlens 101 is provided in each photoelectric converting unit 102, and focuses the incident light onto the photoelectric converting unit 102.

The first wiring layer 120 is provided on the second layer 200 side (the negative side of the Z axis in the figure) than the first substrate 110. The first wiring layer 120 includes a plurality of wires 180 formed of a conductive film (metal film), a plurality of connection units 190 and blocking film (insulating layer). The first wiring layer 120 includes a plurality of wires 180 including wires electrically connected to the power supply or the circuit or the like, wires for transmitting the signal from the first layer 100 (pixels) to the second layer 200, wires for transmitting the signal from the second layer 200 to the first layer 100 (pixels). The first wiring layer 120 may be multilayer, also, may be provided with a passive element and an active element. The connection unit 190 is provided on the front surface of the first wiring layer 120 (the surface on the negative side of the Z axis) and connected to the wires 180. Also, as described below, the connection unit 190 is also used to aid layer-to-layer connections. The connection unit 190 is a bump, a pad, an electrode and so on, formed of a conductive material such as copper, for example. It should be noted that the connection unit may be formed of gold, silver or aluminum. An insulating layer (blocking film) is formed between the plurality of wires 180 and between the plurality of connection units 190.

The second layer 200 includes a second substrate 210 provided with the signal processing circuit 202 and the control circuit, a second wiring layer 220 and a wiring layer 230. The second wiring layer 220 is provided on the first layer 100 side (the positive side of the Z axis in the figure) than the second substrate 210. The wiring layer 230 is provided on the third layer 300 side than the second substrate 210 (the negative side of the Z axis in the figure), and provided between the second substrate 210 and the third layer 300.

The second layer 200, similar to the first layer 100, includes a plurality of wires 180 provided in the second wiring layer 220, a plurality of connection units 190 provided in the second wiring layer 220 and the wiring layer 230, and a blocking film (the insulating layer) provided in the second wiring layer 220 and the wiring layer 230. The second wiring layer 220 includes a plurality of wires 180 and connection units 190 for connecting electrically to the power supply or the circuit or the like, transmitting the signal from the first layer 100 (pixels) to the signal processing circuit 202, and transmitting the signal from the control circuit to the first layer 100 (pixels). The wires 180 and the connection unit 190 may be further provided in the wiring layer 230.

The second layer 200 further includes a TSV (Through Silicon Electrode) 106 that connects the circuits provided on the front and back surface respectively to each other. The TSV 106 is preferred to be provided in the peripheral region. The TSV 106 transmits the image data or the like produced by the image processing circuit 302 to the first layer 100. The TSV 106 may be provided in the first layer 100 and the third layer 300.

It should be noted that as described above, the signal processing circuit 202 and the control circuit are provided in each pixel with a photoelectric converting unit 102, or each block formed of a plurality of pixels. Among the plurality of wires 180, the signal line that transmits the signal from the pixel to the AD converting unit of the signal processing circuit 202 and the control wire that transmits the signal from the control circuit to the pixel are provided between the photoelectric converting unit 102, and the signal processing circuit 202 and the control circuit. In this way, the signal processing circuit 202 can read out the signals for each pixel or each block of the pixel, also, the control circuit can control each pixel or control the pixel for each block of the pixel.

The third layer 300 includes a third substrate 310 provided with an image processing circuit 302 and a third wiring layer 320. The third wiring layer 320 is provided between the third substrate 310 and the second layer 200.

The third layer 300, similar to the first layer 100, includes wires 180 and a plurality of connection units 190 provided in the third wiring layer 320 and a blocking film (insulating layer). The third wiring layer 320 includes a plurality of wires 180 and connection units 190 for connecting electrically to the power supply or the circuit or the like, and transmitting the signal from the signal processing circuit 202 to the image processing circuit 302, and transmitting the signal from the image processing circuit 302 to the control circuit of the second layer 200.

It should be noted that the first layer 100, the second layer 200 and the third layer 300 are each stacked by the electrical connection between the connection units 190 provided in each layer and the bonding between the wiring layers (insulating layers) of the respective layers.

When the first layer 100 is stacked with the second layer 200, a stacked surface 150 is configured by a surface on the negative side of the Z axis of the first wiring layer 120 and a surface on the positive side of the Z axis of the second wiring layer 220. Similarly, when the second layer 200 is stacked with the third layer 300, a stacked surface 160 is configured by a surface on the negative side of the Z axis of the wiring layer 230 and a surface on the positive side of the Z axis of the third wiring layer 320. A plurality of connection units 190 are arranged on the stacked surface 150 and the stacked surface 160. Specifically, corresponding connection units 190 are aligned with each other and the two layers are stacked to electrically connect the aligned connection units.

The first layer 100, the second layer 200 and the third layer 300 are stacked in a state of wafers before being made into chips, and formed (individualized) by dicing the stacked wafers.

During stacking the wafers, the surfaces of the wafers to be stacked are scanned and activated with plasma by the activation apparatus. Wafers whose stacked surfaces are activated are bonded by hydrogen bonds, van der Waals bonds, and covalent bonds and the like resulting from contact to form stacked substrates. If the wafers are hydrogen bonded by mutual contact, covalent bonds are generated between the wafers by heating the stacked substrate in an annealing furnace or other heating device after the stacked substrate is formed.

It should be noted that wafer activation refers to the treatment of at least one of the stacked surfaces of a wafer so that hydrogen bonds, van der Waals bonds, covalent bonds and so on are generated by contact between the stacked surfaces of the wafer, and the surfaces are bonded in the solid phase without melting. For example, activation includes promoting bonding by generating dangling bonds (unbounded hands) on the stacked surfaces of the wafer.

More specifically, the activation apparatus, for example, excites oxygen gas, which is the processing gas, under a reduced pressure atmosphere to form plasma and irradiate oxygen ions to the surface to be stacked. For example, if the wafer is a silicon substrate with an oxide film formed thereon such as SiO, oxygen ion irradiation will disconnect the SiO bonds on the stacked surface, forming Si and O dangling bonds.

When the stacked surfaces with dangling bonds are exposed to air, for example, moisture in the air bonds to the dangling bonds and the substrate surface is covered with hydroxyl groups (OH groups), which bond to water molecules and easily become hydrophilic. In other words, the activation promotes hydrophilicity of the stacked surface. Also, in solid phase bonding, the presence of impurities such as oxides, defects or the like on the surfaces to be stacked affect the bonding strength, so activation may include cleaning the surfaces to be stacked.

Furthermore, wafer activation may include hydrophilization of the stacked surfaces by applying pure water or other liquids to the surfaces to be stacked using a hydrophilic device. Hydrophilization causes the stacked surfaces of the wafer to become attached to, that is, terminated with, OH groups.

By heat-treating the stacked substrate, the connection units provided on each of the stacked surfaces of the wafers are integrated and electrically connected. When the connection units are formed of conductive materials such as copper, the aligned connection units are expanded and pressed together by the heat treatment and bonded by solid phase diffusion.

Conventionally, pixels with a photoelectric converting unit, an AD converting unit, a control unit and so on are provided on the same substrate. The AD converting unit, the control unit and so on are provided in the area surrounding the region where the plurality of pixels are provided. The image capturing device 10 according to the present embodiment has a stacked structure, with pixels having a photoelectric converting unit 102 provided in the first layer 100, and signal processing circuit 202 having an AD converting unit and control circuit in the second layer 200. The signal processing circuit 202 performs reading out signals for each pixel having a photoelectric converting unit 102 or for each block formed of a plurality of pixels. The control circuit controls pixels for each pixel having a photoelectric converting unit 102 or for each block formed of a plurality of pixels. This allows the image capturing device 10 to achieve faster signal processing compared to conventional image capturing devices. On the other hand, since the image capturing device 10 becomes to have more signal processing circuits 202 and control circuits compared to conventional image capturing devices, the amount of heat generated by the signal processing circuits 202 and control circuits increases compared to conventional image capturing devices. Particularly, the amount of heat generated by the signal processing circuit 202 increases compared to conventional image capturing devices.

Also, conventionally, the image processing unit for image processing the signal output from the image capturing device is provided separately from the image capturing device. The image capturing device 10 according to the present embodiment is stacked with a third layer 300 having an image processing circuit 302 as an image processing unit. The image processing circuit 302 performs processing on signals for each signal processing circuit 202 or for each block being configured by a plurality of signal processing circuits 202. This allows the image capturing device 10 to achieve faster image processing compared to conventional image capturing devices. On the other hand, the image capturing device 10 generates even more amount of heat generated compared to conventional image capturing devices due to that the image processing circuit 302 is provided.

Therefore, heat generated in the signal processing circuit 202 and image processing circuit 302 is transferred to the first layer 100. If heat is transferred to the first layer and the temperature of the pixels (the photoelectric converting unit 102, the FD, the transmission unit, and the output unit) rises, noise such as dark current and shot noise is likely to occur. This increases the noise included in the signal produced by the pixels. The increased noise can cause image quality degradation.

Therefore, in the image capturing device 10, the heat generated in the signal processing circuit 202 and the image processing circuit 302 requires to be dissipated to the exterior. Particularly, the heat generated in the signal processing circuit 202 and the image processing circuit 302 requires to be dissipated to the negative side of the Z axis from the first layer so that the heat is not transferred to the pixels. Alternatively, heat requires to be shielded on the negative side of the Z axis from the pixels so that heat is not transferred to the pixels.

In the present example, a heat conduction layer is provided in the third wiring layer 320. The heat conduction layer has higher heat conductivity than the insulating layer included in the third wiring layer 320. The heat conduction layer is formed of, for example, copper. It should be noted that the heat conduction layer may be formed of gold, silver, or aluminum.

The heat conduction layer of the present example may be a heat conduction layer 410 formed by the same process with the wires 180 as shown in FIG. 2. However, although the wires 180 are electrically connected to the power supply or the circuit or the like, the heat conduction layer 410 is not electrically connected to the power supply or the circuit or the like. In FIG. 2, although the heat conduction layer 410 is shown to be multilayer, it may also be a single layer.

In the present example, the heat generated in the image processing circuit 302 provided in the third substrate 310 is transferred to the heat conduction layer 410 provided in the third wiring layer 320. The heat transferred to the heat conduction layer 410 is dissipated to the exterior via the heat conduction layer 410. That is, the heat dissipation of the heat generated in the image processing circuit 302 is promoted by the heat conduction layer 410. In this way, the heat generated in the image processing circuit 302 can be suppressed to be transferred to the first layer 100.

It should be noted that in FIG. 2, although the heat conduction layer 410 is provided in the third layer 300, it may also be provided in the second layer 200. Also, it may be provided in the second layer 200 and the third layer 300. Specifically, the heat conduction layer 410 with higher heat conductivity than the wiring layer 230 is provided in the wiring layer 230. In this way, the heat generated in the signal processing circuit 202 provided in the second substrate 210 is transferred to the heat conduction layer 410 provided in the wiring layer 230. The heat transferred to the heat conduction layer 410 is dissipated to the exterior via the heat conduction layer 410. The heat dissipation of the heat generated in the signal processing circuit 202 is promoted by the heat conduction layer 410. Also, since the heat conduction layer 410 is provided on the third layer 300 side (negative side of the Z axis) than the second substrate 210, the heat generated in the signal processing circuit 202 can be suppressed to be transferred to the first layer 100.

Figure 3:
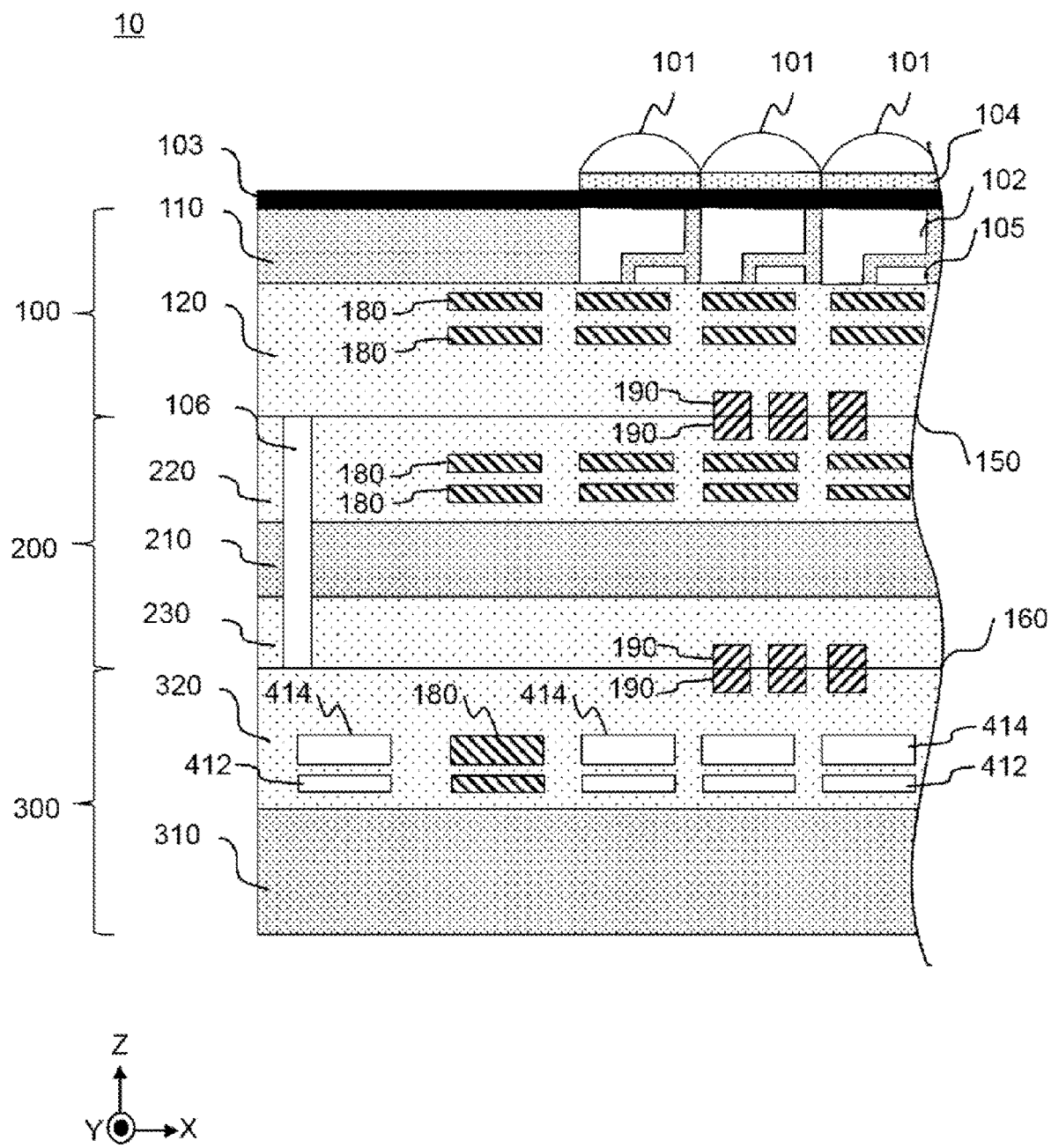
FIG. 3 illustrates one example of the cross-sectional view in the X-Z direction of the image capturing device 10 according to the present embodiment.

FIG. 3 illustrates one example of the cross-sectional view in the X-Z direction of the image capturing device 10 according to the present embodiment. Herein, the same signs are given to the elements common with those in FIG. 2, and the descriptions are omitted.

The heat conduction layer of the present example includes a first heat conduction layer 412 provided in the third wiring layer 320, and a second heat conduction layer 414, which is thicker than the first heat conduction layer 412, provided on the second layer 200 side (the positive side of the Z axis) than the first heat conduction layer 412 in the third wiring layer 320. The first heat conduction layer 412 and the second heat conduction layer 414 are one example of the heat conduction layer 410 shown in FIG. 2. Herein, "thick" refers to a long length in the X-Z direction.

The second heat conduction layer 414 that is thicker than the first heat conduction layer 412 has higher heat conductivity than the first heat conduction layer 412. Therefore, not only the heat generated in the image processing circuit 302, but also the heat generated in the signal processing circuit 202 of the second layer 200 is transferred to the second heat conduction layer 414 and dissipated to the exterior of the image capturing device 10. That is, the heat dissipation of the heat generated in the signal processing circuit 202 is promoted by the second heat conduction layer 414. Also, the heat generated in the signal processing circuit 202 can be suppressed to be transferred to the first layer 100.

It should be noted that the heat generated in the second layer 200 is described as the heat from the signal processing circuit 202, can also refer to the heat generated in the control circuit of the second layer 200. The second heat conduction layer 414 may also be used for the heat dissipation of the heat generated in the control circuit of the second layer 200. When referring to the signal processing circuit 202 with respect to heat generation measures, the control circuit of the second layer 200 shall also be included.

Figure 4:
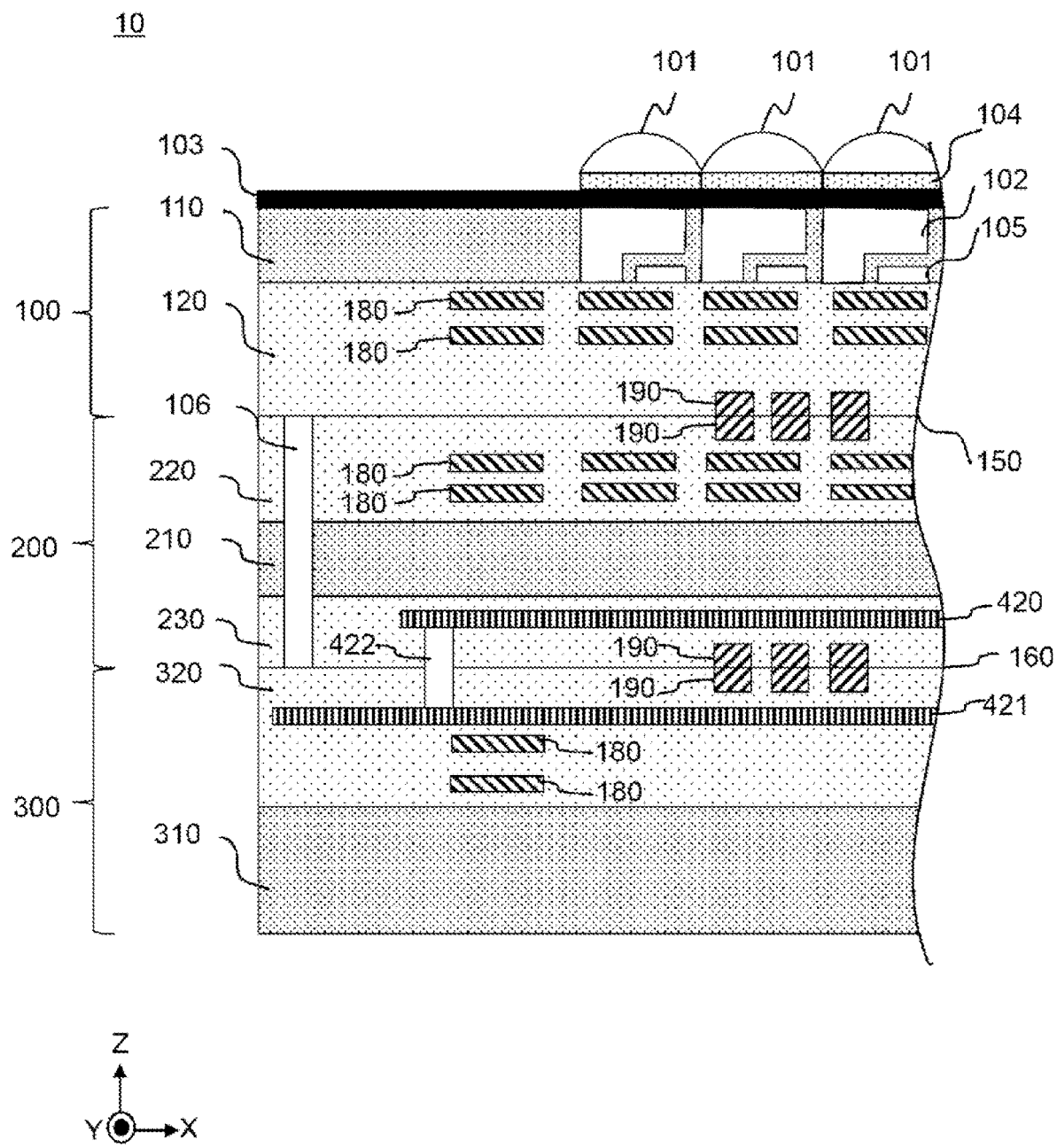
FIG. 4 illustrates one example of the cross-sectional view in the X-Z direction of the image capturing device 10 according to the present embodiment.

FIG. 4 illustrates one example of the cross-sectional view in the X-Z direction of the image capturing device 10 according to the present embodiment. Herein, the same signs are given to the elements common with those in FIG. 2, and the descriptions are omitted.

The heat conduction layer of the present example includes a heat conduction board covering the light-receiving region provided by one or more pixels. Herein, the light-receiving region refers to a region to which a region where one or more pixels are provided, projected onto a surface parallel to the X-Y surface.

As one example, the heat conduction board includes a first heat conduction board 420 provided in the second layer 200, and a second heat conduction board 421 provided in the third layer 300. The first heat conduction board 420 is provided in the wiring layer 230, and the second heat conduction board 421 is provided in the third wiring layer 320. The first heat conduction board 420 and the second heat conduction board 421 are formed of a thermally conductive material such as copper, aluminum and so on. It should be noted that the heat conduction layer may be formed of a metal such as gold, silver or the like. It should be noted that the heat conduction board may be provided with either one of the first heat conduction board 420 or the second heat conduction board 421.

The area of the second heat conduction board 421 may be greater than the area of the first heat conduction board 420. Since the second heat conduction board 421 that is greater than the first heat conduction board 420 has higher heat conductivity than the first heat conduction board 420, it transfers more heat than the first heat conduction board 420. Therefore, the heat generated in the signal processing circuit 202 is transferred to the first heat conduction board 420 as well as to the second heat conduction board 421. The heat transferred to the first heat conduction board 420 is dissipated to the exterior of the image capturing device 10 via the second heat conduction board 421. Also, the heat generated in the image processing circuit 302 is transferred to the second heat conduction board 421 and dissipated to the exterior of the image capturing device 10. That is, the heat dissipation of the heat generated in the signal processing circuit 202 and the image processing circuit 302 is promoted by the first heat conduction board 420 and the second heat conduction board 421.

The first heat conduction board 420 and the second heat conduction board 421 may be connected by the coupling unit 422. The coupling unit 422 may be formed of a thermally conductive material extending in the stack direction. In this way, the heat transferred to the first heat conduction board 420 tends to be further transferred to the second heat conduction board 421, and dissipated to the exterior of the image capturing device 10.

The first heat conduction board 420 and the second heat conduction board 421 may be covered by the insulating layer all around. Being covered by the insulating layer all around refers to that all of the upper surface, lower surface and the side surfaces being covered by the insulating layer. For example, the insulating layer is an insulating layer included in the wiring layer 230 and the third wiring layer 320. In this way, the first heat conduction board 420 and the second heat conduction board 421 are electrically blocked to the other elements.

Figure 5:
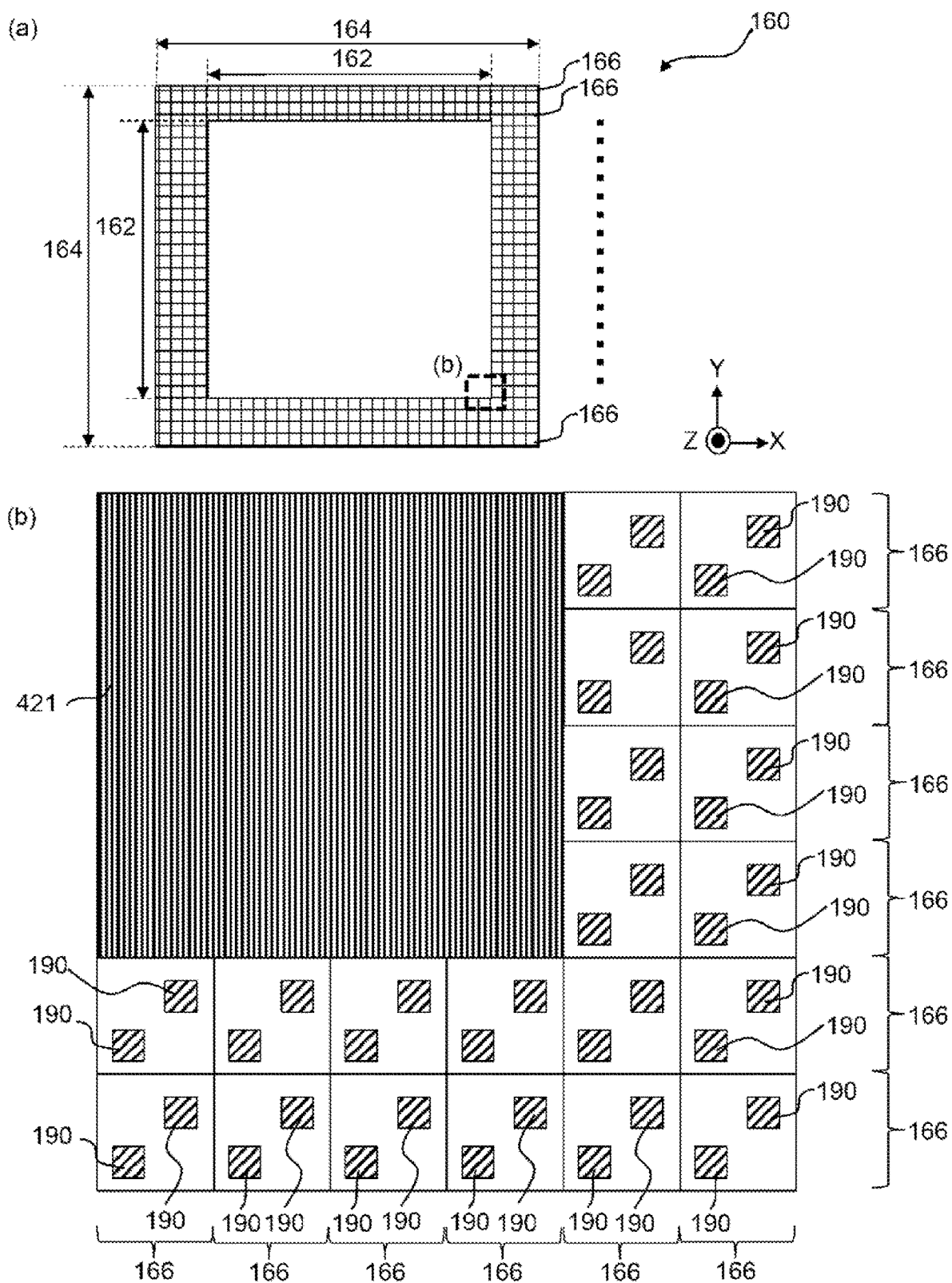
FIG. 5 illustrates one example of a cross-sectional view in an X-Y direction of the image capturing device 10 according to the present embodiment.

FIG. 5 illustrates one example of the cross-sectional view in the X-Y direction of the image capturing device 10 according to the present embodiment. Specifically, FIG. 5 illustrates a state of observing the third layer 300 from the stacked surface 160 toward the negative side of the Z axis, and the elements such as the third wiring layer 320 and so on are omitted for simplicity.

As shown in (a), the stacked surface 160 of the present example includes a first region 162, including the region around the center of the stacked surface 160, and a second region 164 between the outer circumference of the first region 162 and the outer circumference of the stacked surface 160. The first region 162 refers to a region where the element for bonding (stacking) the second layer 200 and the third layer 300 is not arranged on the stacked surface 160, and the second region 164 refers to a region where such elements are arranged on the stacked surface 160. The second region 164 is arranged on the stacked surface 160 as an element for bonding (stacking) the second layer 200 and the third layer 300, with a connection unit 190 for electrically connecting the circuit provided in the second layer 200 and the circuit provided in the third layer 300.

(b) illustrates an enlarged view of the area near the boundary between the first region 162 and the second region 164. In the present example, in the wiring layer 230, the connection unit 190 is arranged in the stacked surface 160 in the second region 164. Also, in the third wiring layer 320, the second heat conduction board 421 is provided to cover the first region 162, and the connection unit 190 is arranged in the stacked surface 160 in the second region 164. The second heat conduction board 421 is one example of the heat conduction layer. In the present example, the second region 164 includes a plurality of third regions 166 where the two connection units 190 are arranged on the diagonal. It should be noted that the number of the connection units 190 arranged in the third region 166 may be one or may be more than two as long as the bonding strength and the flatness are secured. It should be noted that although the shape of the cross-sectional view in the X-Y direction of the connection unit 190 is presented to be a rectangle, it is not limited thereto, and may be any other shape.

Generally, the amount of heat generated of the circuit may be greater around the center than the peripheral region of the circuit. In the image capturing device 10 regarding the present embodiment, the amount of the heat generated around the center of the second substrate 210 provided with the signal processing circuit 202, or generated around the center of the third substrate 310 provided with the image processing circuit 302, is respectively greater than that in the peripheral region of the circuit. Therefore, while arranging the plurality of connection units 190 collectively in the outer circumference of the stacked surface 160 and securing the bonding strength, by arranging the second heat conduction board 421 around the center with a large amount of heat generated, the heat generated in the circuit can be effectively dissipated to the exterior.

Figure 6:
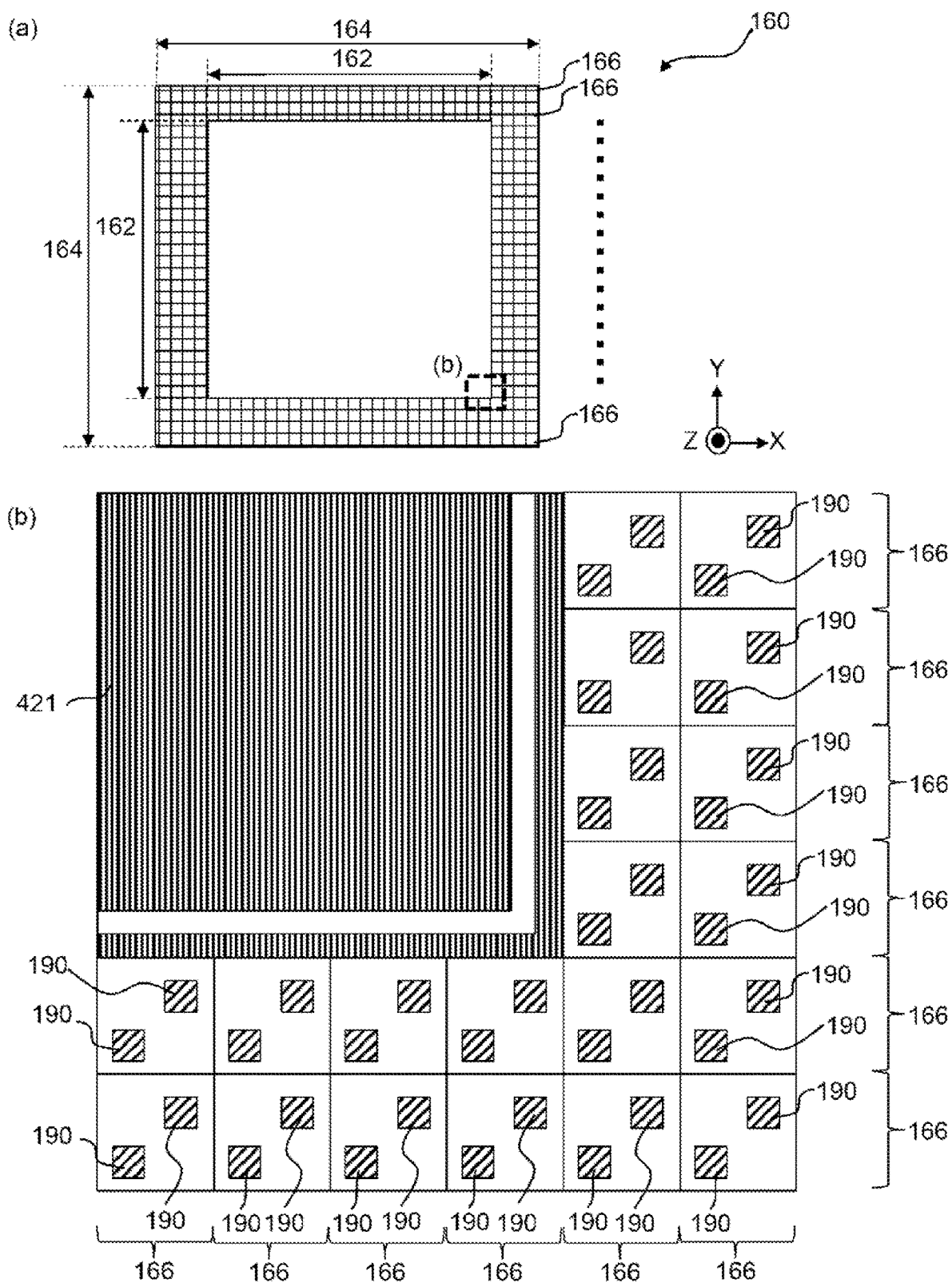
FIG. 6 illustrates one example of a cross-sectional view in the X-Y direction of the image capturing device 10 according to the present embodiment.

FIG. 6 illustrates one example of the cross-sectional view in the X-Y direction of the image capturing device 10 according to the present embodiment. Herein, the same signs are given to the elements common with those in FIG. 5, and the descriptions are omitted.

As shown in (b), in the present example, similar to FIG. 5, in the wiring layer 230, the connection unit 190 is arranged in the stacked surface 160 in the second region 164. Also, in the third wiring layer 320, the second heat conduction board 421 is provided to cover the first region 162, and the connection unit 190 is arranged in the stacked surface 160 in the second region 164. In the present example, in the wiring layer 230, the first heat conduction board 420 is provided to cover the first region 162. Also, the coupling unit 422 is provided along the outer circumference of the second heat conduction board 421. The coupling unit 422 connects the first heat conduction board 420 and the second heat conduction board 421 that are not illustrated. In this way, the heat transferred to the first heat conduction board 420 is further transferred to the second heat conduction board 421 and dissipated to the exterior of the image capturing device 10.

Figure 7:
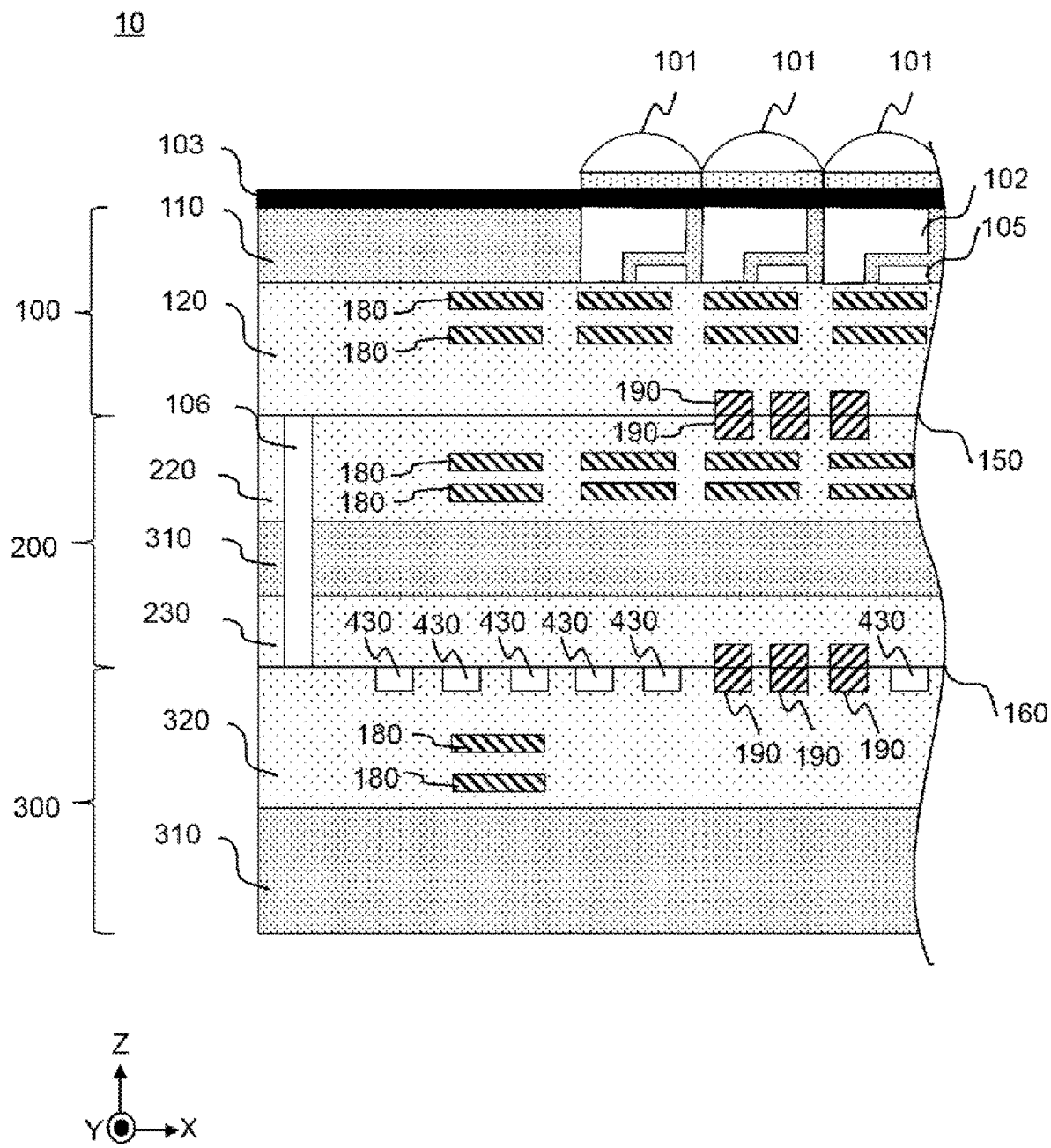
FIG. 7 illustrates one example of the cross-sectional view in the X-Z direction of the image capturing device 10 according to the present embodiment.

FIG. 7 illustrates one example of the cross-sectional view in the X-Z direction of the image capturing device 10 according to the present embodiment. Herein, the same signs are given to the elements common with those in FIG. 2, and the descriptions are omitted.

In the present example, the plurality of connection units arranged in the stacked surface 160 include connection units 190 connected opposite to each other in the stack direction with the corresponding connection units, and disconnection units 430 that are not opposite to the other connection units in the stack direction. The disconnection unit 430 is one example of the heat conduction layer. The disconnection unit 430 may be formed by the same process as that of the connection unit 190. However, although the connection unit 190 electrically connects the circuit provided in the second layer 200 and the circuit provided in the third layer 300, the disconnection unit 430 is not connected to the other connection units, and does not electrically connect the circuit provided in the second layer 200 and the circuit provided in the third layer 300. In other words, the disconnection unit is a dummy connection unit.

The disconnection unit 430 of the present example is provided in the third layer 300. Specifically, the plurality of disconnection units 430 are arranged on the stacked surface 160 in the third wiring layer 320, but are not arranged in the wiring layer 230. In this way, the heat generated in the signal processing circuit 202 and the image processing circuit 302 is transferred to the disconnection unit 430 and dissipated to the exterior of the image capturing device 10. Or the disconnection unit 430 may be arranged on the stacked surface 160 alternately in the wiring layer 230 and the third wiring layer 320.

Figure 8:
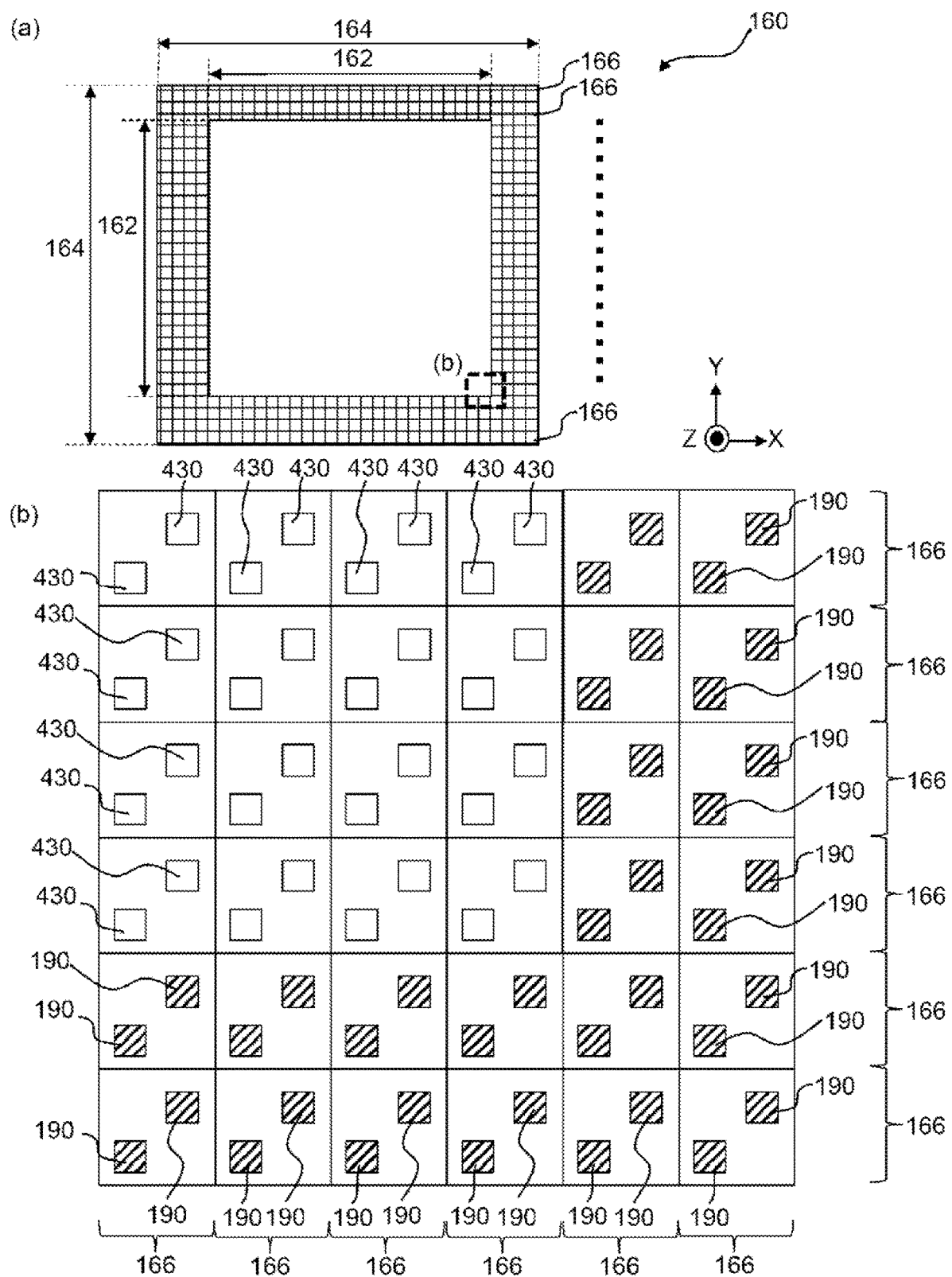
FIG. 8 illustrates one example of the cross-sectional view in the X-Y direction of the image capturing device 10 according to the present embodiment.

FIG. 8 illustrates one example of the cross-sectional view in the X-Y direction of the image capturing device 10 according to the present embodiment. Herein, the same signs are given to the elements common with those in FIG. 5, and the descriptions are omitted.

In the present example, the disconnection unit 430 is arranged in the first region 162, the connection unit 190 is arranged in the second region 164. In this way, by arranging the plurality of connection units 190 in the outer circumference of the stacked surface 160, while securing the bonding strength between the layers, the heat conduction layer can be provided in the first region 162.

Figure 9:
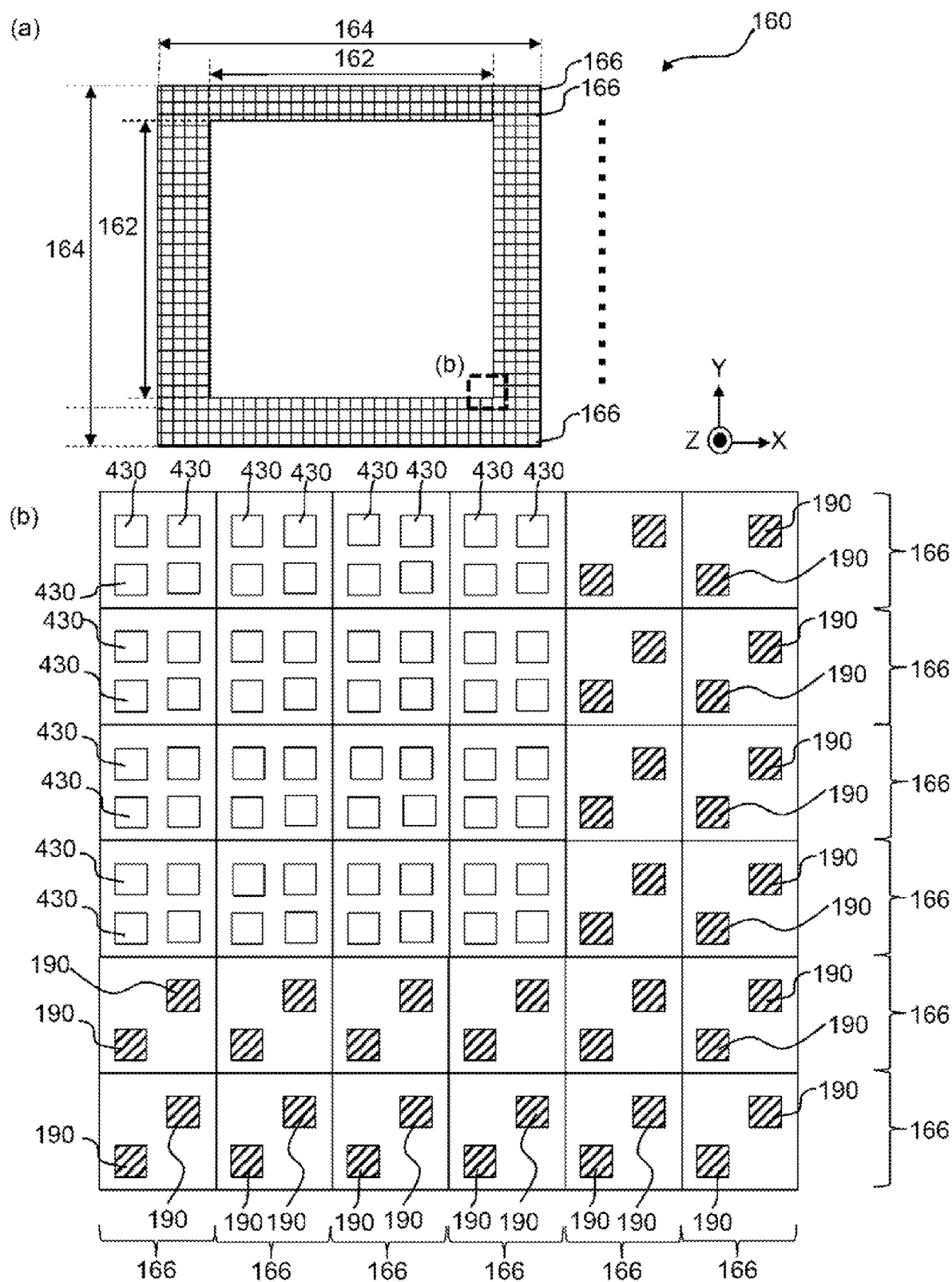
FIG. 9 illustrates one example of the cross-sectional view in the X-Y direction of the image capturing device 10 according to the present embodiment.

FIG. 9 illustrates one example of the cross-sectional view in the X-Y direction of the image capturing device 10 according to the present embodiment. Herein, the same signs are given to the elements common with those in FIG. 5, and the descriptions are omitted.

In the present example, similar to FIG. 8, the disconnection unit 430 is arranged in the first region 162, the connection unit 190 is arranged in the second region 164. However, the density of the arrangement of the disconnection units 430 is higher than the density of the arrangement of the connection units 190. As one example, in the second region 164, two connection units 190 are arranged on the diagonal for each third region 166, on the other hand, in the first region 162, four disconnection units 430 are arranged for each third region 166. In this way, by arranging the disconnection units 430 at a higher density than the second region 164, the heat generated in the circuit can be effectively dissipated to the exterior.

Figure 10:
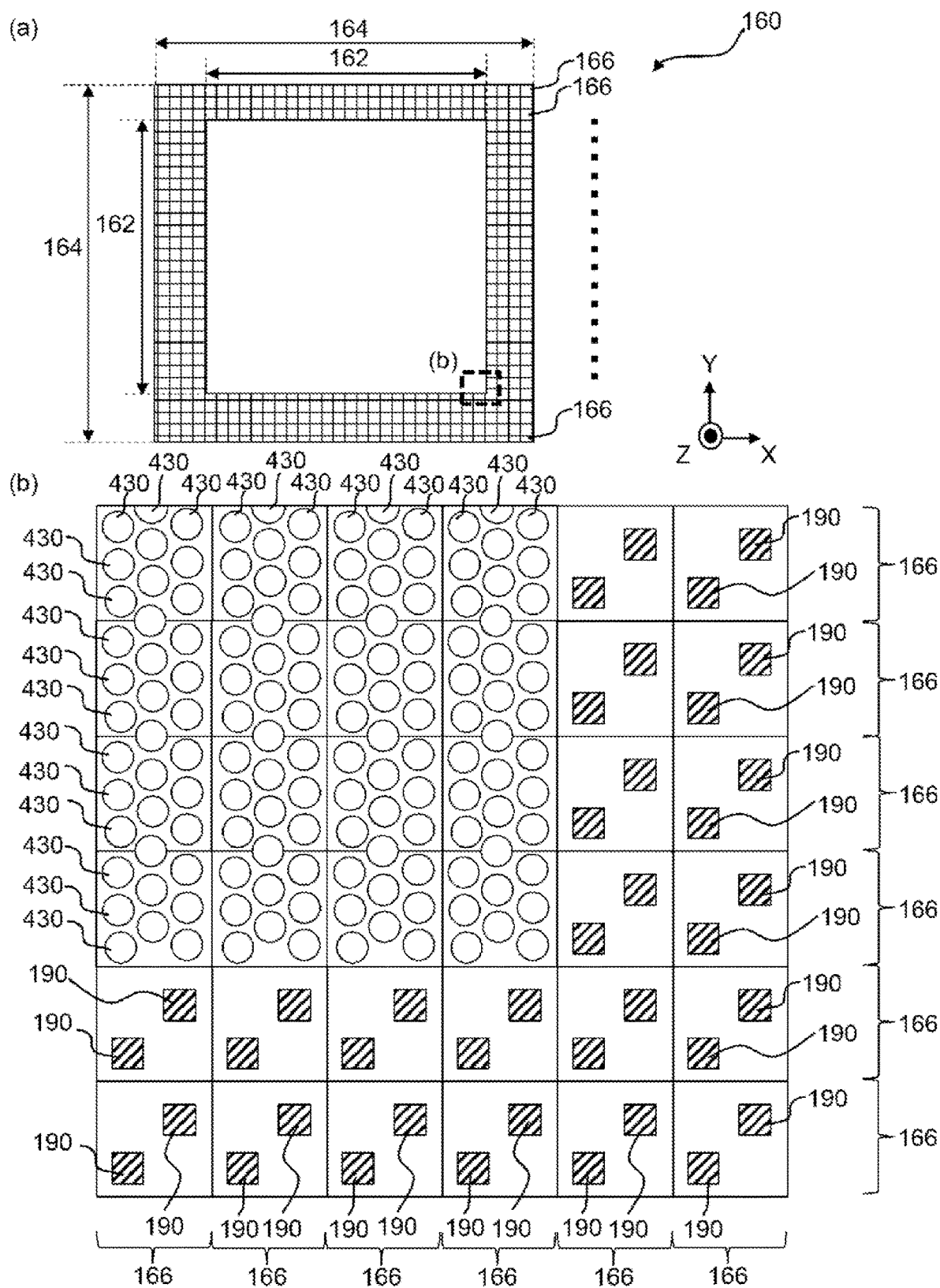
FIG. 10 illustrates one example of the cross-sectional view in the X-Y direction of the image capturing device 10 according to the present embodiment.

FIG. 10 illustrates one example of the cross-sectional view in the X-Y direction of the image capturing device 10 according to the present embodiment. Herein, the same signs are given to the elements common with those in FIG. 5, and the descriptions are omitted.

In the present example, the connection unit 190 has a rectangular cross-sectional view in the stack direction, the disconnection unit 430 has a circular cross-sectional view in the stack direction. Also, the distance between the disconnection units 430 that are adjacent to each other is shorter than the distance between the connection units 190 that are adjacent to each other. In this way, by making the disconnection units 430 circular in cross-section, fine packing is possible, and the disconnection units 430 can be arranged at an even higher density.

Figure 11:
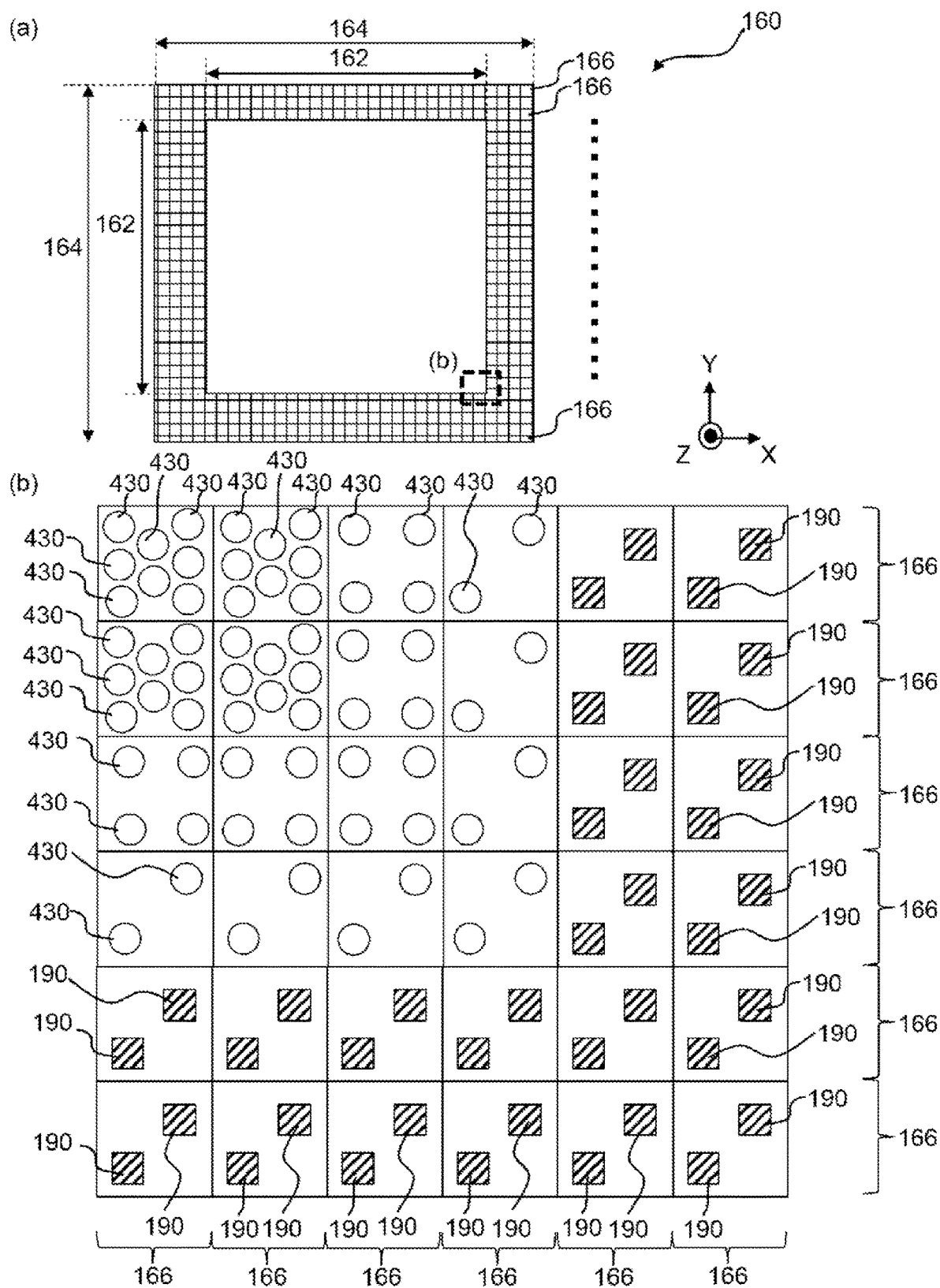
FIG. 11 illustrates one example of the cross-sectional view in the X-Y direction of the image capturing device 10 according to the present embodiment.

FIG. 11 illustrates one example of the cross-sectional view in the X-Y direction of the image capturing device 10 according to the present embodiment. Herein, the same signs are given to the elements common with those in FIG. 5, and the descriptions are omitted.

In the present example, the arrangement density of the disconnection units 430 for each third region 166 is greater in the third region 166 as being closer to the center of the stacked surface 160. The amount of heat generated in the circuit increases toward the region around the center of the circuit and decreases toward the peripheral region. In this way, heat can be dissipated uniformly by increasing the density at which the disconnection units 430 are arranged closer to the center of the stacked surface 160 in accordance with the amount of heat generated in the circuit. This allows heat to be uniformly transferred to the plurality of pixels (photoelectric converting units 102), thereby preventing image quality deterioration due to temperature irregularities.

Figure 12:
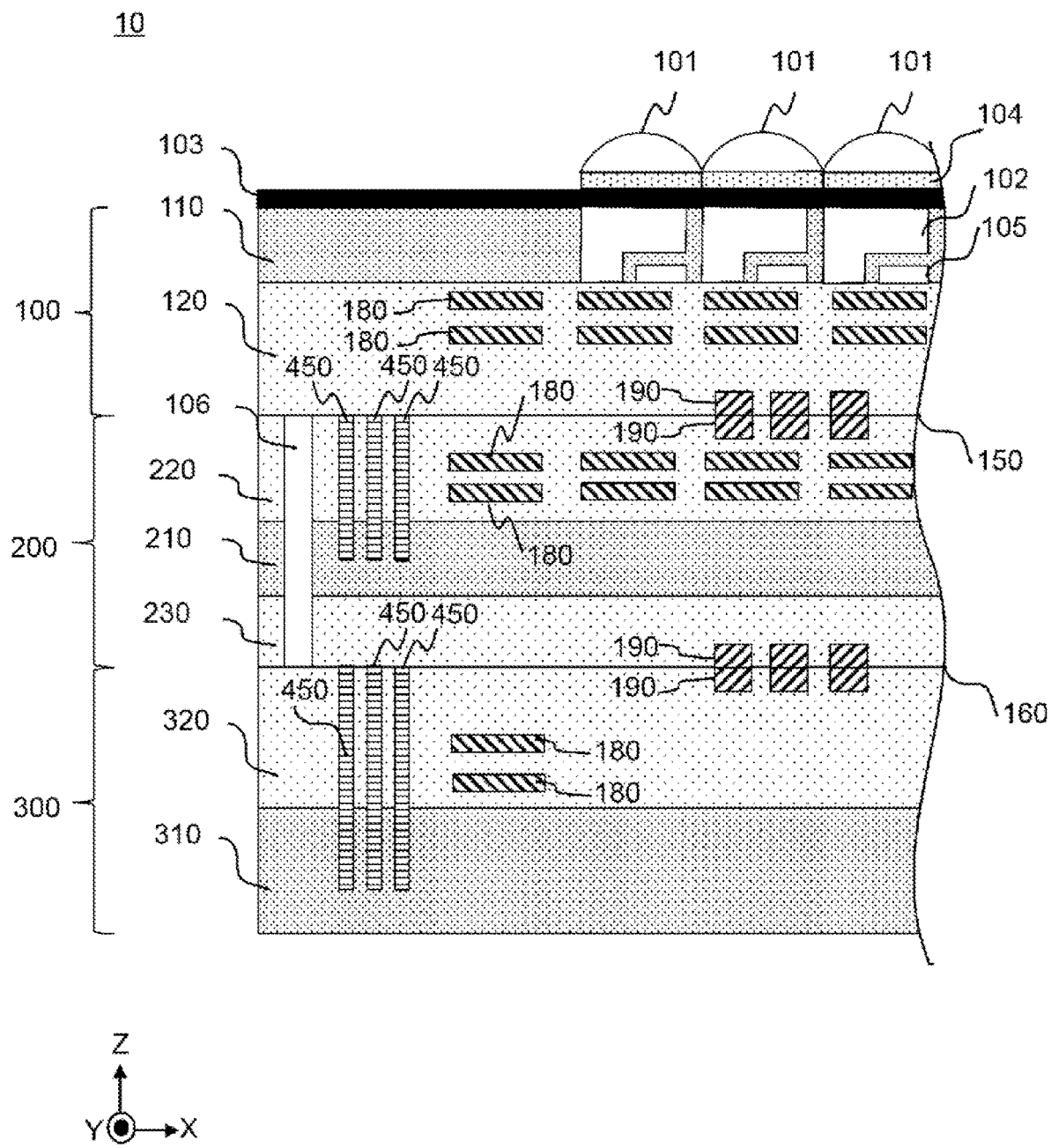
FIG. 12 illustrates one example of the cross-sectional view in the X-Z direction of the image capturing device 10 according to the present embodiment.

FIG. 12 illustrates one example of the cross-sectional view in the X-Z direction of the image capturing device 10 according to the present embodiment. Herein, the same signs are given to the elements common with those in FIG. 2, and the descriptions are omitted.

In the present example, the heat dissipation layer 450 extending in the stack direction is provided in the peripheral region corresponding to the invalid pixels. The heat dissipation layer 450 is one example of the heat conduction layer.

The heat dissipation layer 450 is formed of a metal such as gold, silver, copper, aluminum or the like.

The heat dissipation layer 450 may be multilayer, or may be a single layer. The heat dissipation layer 450 may be provided in the peripheral region of the signal processing circuit 202 of the second layer 200, and extend in the stack direction from the second wiring layer 220 to the interior of the second substrate 210. The heat dissipation layer 450 may be further provided in the peripheral region of the image processing circuit 302 of the third layer 300, and extend in the stack direction from the third wiring layer 320 to the interior of the third substrate 310.

In this way, since the heat dissipation layer 450 is provided in the peripheral region, it is not a support for any other element. Also, since the heat dissipation layer 450 can be formed by the same process as the TSV 106, the process is not complicated.

Figure 13:
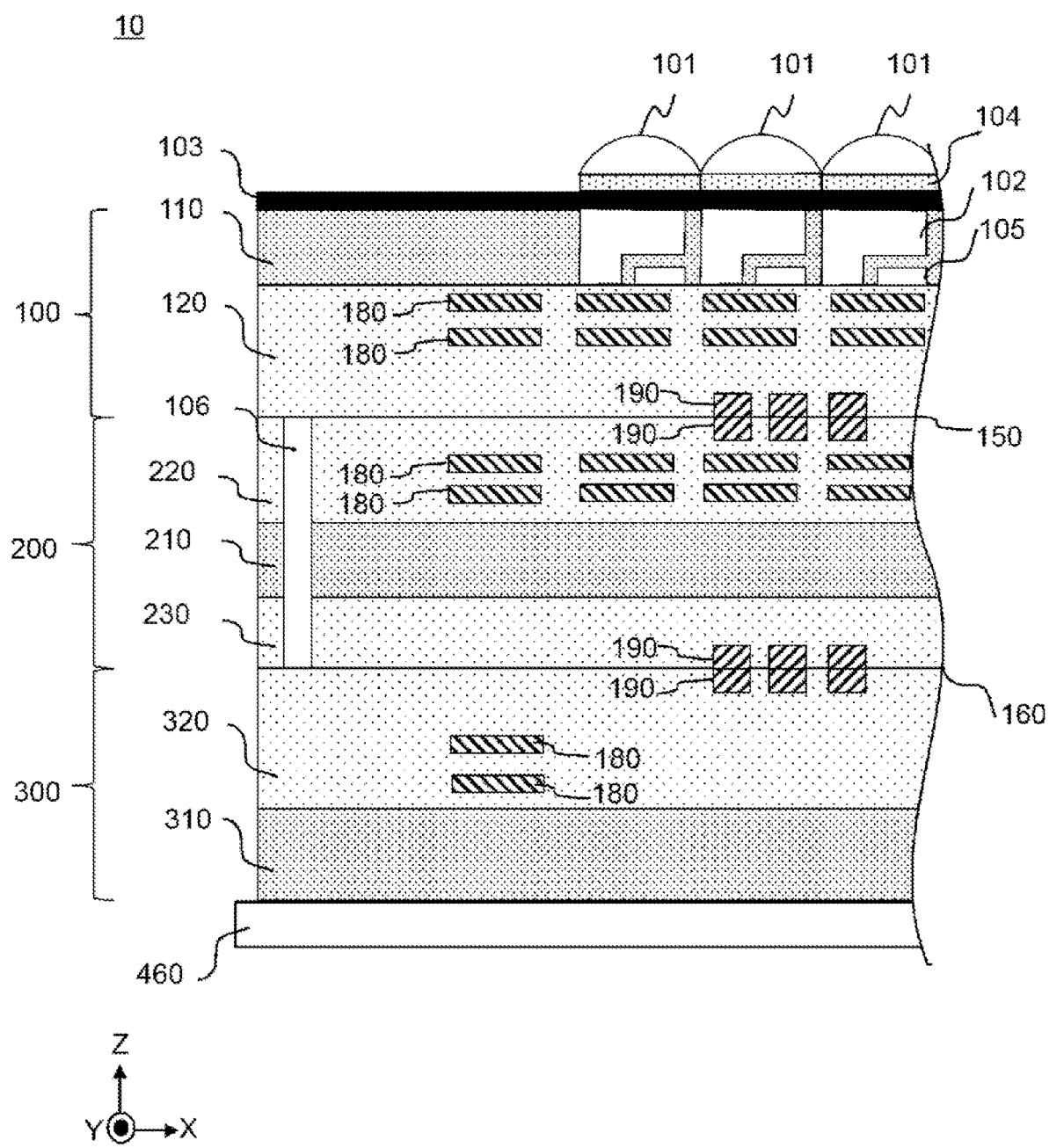
FIG. 13 illustrates one example of the cross-sectional view in the X-Z direction of the image capturing device 10 according to the present embodiment.

FIG. 13 illustrates one example of the cross-sectional view in the X-Z direction of the image capturing device 10 according to the present embodiment. Herein, the same signs are given to the elements common with those in FIG. 2, and the descriptions are omitted.

In the present example, the heat conduction board 460 is provided on the negative side of the Z axis than the third layer 300. The heat conduction board 460 is one example of the heat conduction layer. Since the heat conduction board 460 is provided on the negative side of the Z axis than the third layer 300 that is on the opposite side to the pixels provided on the positive side of the Z axis of the first layer 100, by transferring the heat to the heat conduction board 460, the heat can be prevented to be transferred to the pixels.

The heat conduction board 460 may be directly attached to the front surface of the third substrate 310. The front surface of the third substrate 310 may be polished. In this way, the flatness of the third substrate 310 can be improved. Also, by fixing the heat conduction board 460 on the front surface of the third substrate 310, the strength of the third substrate 310 can be improved.

As one example, the heat conduction board 460 is a copper plate. Since it is easy to secure the flatness of the copper plate, the flatness of the image capturing device 10 can be secured. The heat conduction board 460 may be formed of a metal such as gold, silver, aluminum or the like.

The heat conduction board 460 may be directly connected to the housing of the image capturing apparatus provided with the image capturing device 10. In this way, the heat transferred from the image capturing device 10 to the heat conduction board 460 can be further transferred to the housing of the image capturing apparatus, and the heat dissipation can be promoted.

The heat conduction board 460 may cover the entire front surface of the third substrate 310, or may have a surface area greater than the surface area of the third substrate 310 (the area in the XY surface). This can improve the effect of the heat dissipation particular for air-cooling with fans.

Figure 14:
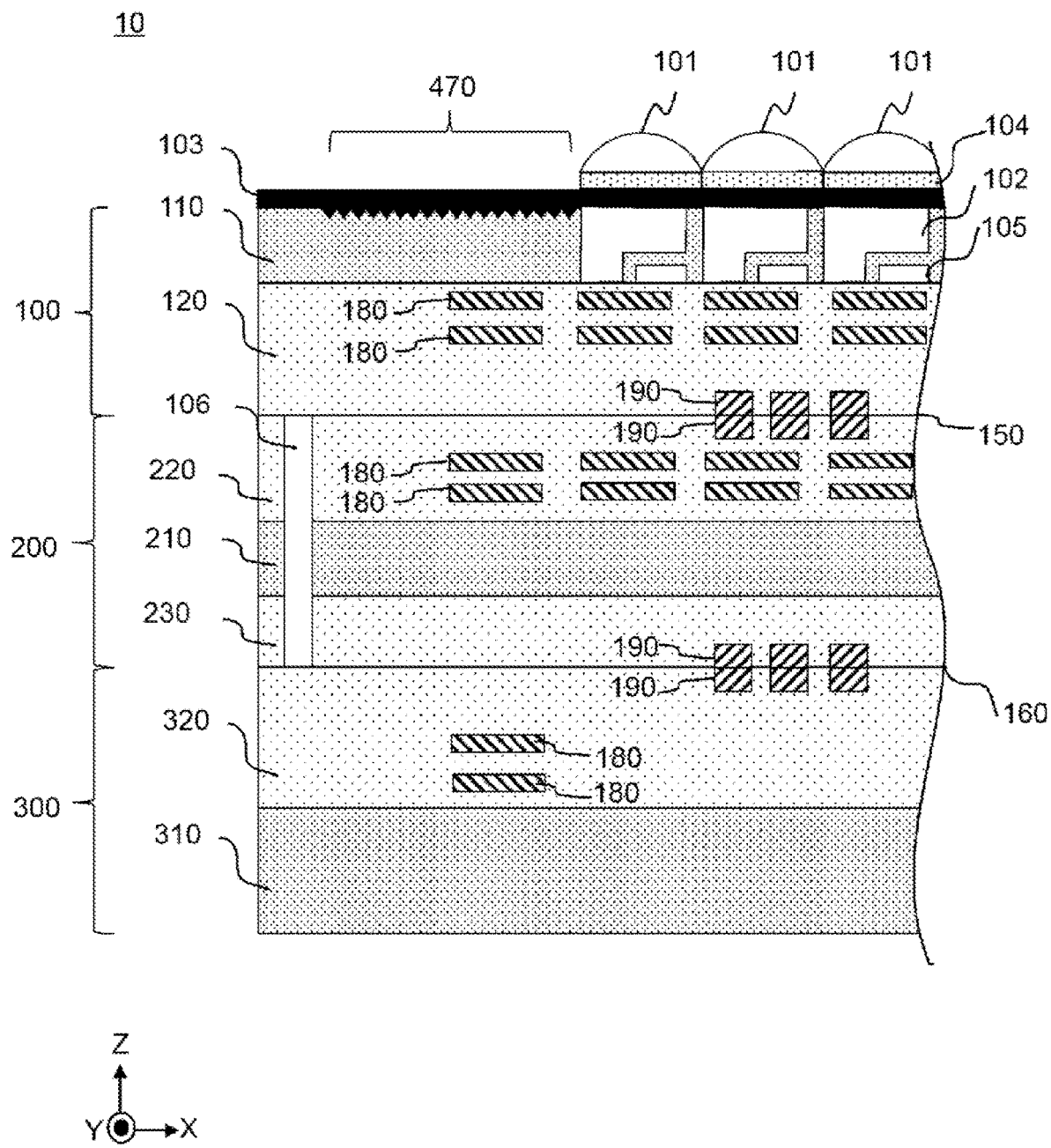
FIG. 14 illustrates one example of the cross-sectional view in the X-Z direction of the image capturing device 10 according to the present embodiment.

FIG. 14 illustrates one example of the cross-sectional view in the X-Z direction of the image capturing device 10 according to the present embodiment. Herein, the same signs are given to the elements common with those in FIG. 2, and the descriptions are omitted.

In the present example, a concavo-convex region 470 with a plurality of concavo-convenes formed therein on the positive side of the Z axis of the first substrate 110 is provided. The concavo-convex region 470 is one example of the heat conduction layer.

The concavo-convex region 470 is provided on the positive side of the Z axis of the first substrate 110 in the peripheral region that is not provided with pixels. Since there is space in the peripheral region, the plurality of concavo-convenes can be easy to be formed.

As one example, the concavo-convex region 470 may be formed from a plurality of triangular pyramidal or conical protrusions arranged on the positive side of the Z axis of the first substrate 110. Or the concavo-convex region 470 may be formed from a plurality of grooves provided on the positive side of the Z axis of the first substrate 110. This can increase the surface area of the first substrate 110 and promote the heat dissipation.

Also, a transferring unit may be provided to exhaust the heat from the heat conduction layer to the exterior of the image capturing device 10. The transferring unit has one end connected to the heat conduction layer, and the other end extending to the exterior of the image capturing device 10. In this way, the transferring unit exhausts the heat transferred through the heat conduction layer to the exterior of the image capturing device 10. The transferring unit may be a slice formed of a metal such as gold, silver, copper, aluminum or the like. Or the transferring unit may have one end connected to the pixels (the photoelectric converting unit 102) by the connection unit 190 or a bonding wire or the like, and the other end extending to the exterior of the image capturing device 10.

Figure 15:
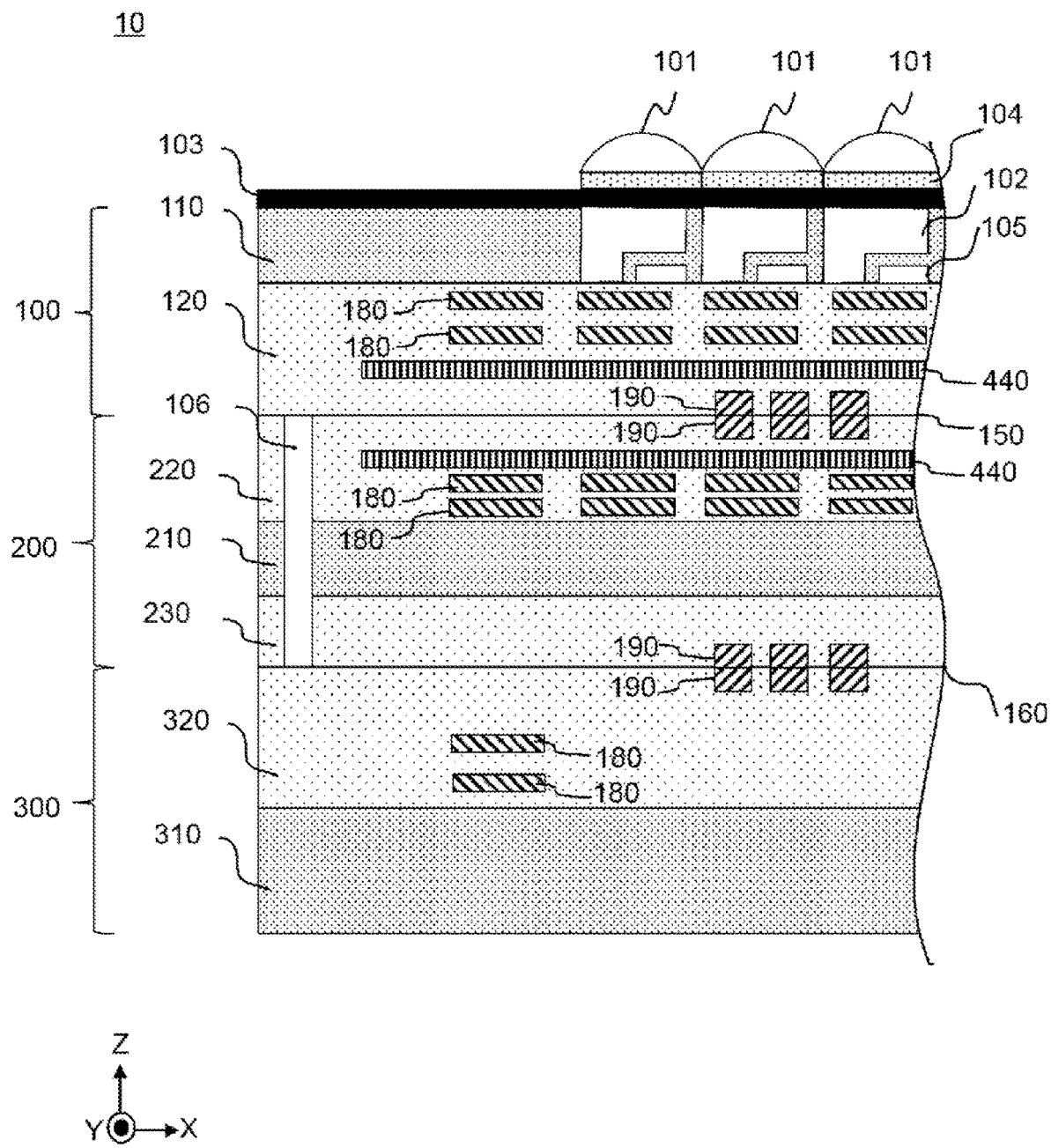
FIG. 15 illustrates one example of the cross-sectional view in the X-Z direction of the image capturing device 10 according to the present embodiment.

FIG. 15 illustrates one example of the cross-sectional view in the X-Z direction of the image capturing device 10 according to the present embodiment. Herein, the same signs are given to the elements common with those in FIG. 2, and the descriptions are omitted.

In the present example, the heat blocking layer 440 is provided in the second wiring layer 220. The heat blocking layer 440 has a lower thermal conductivity than the second wiring layer 220. The heat blocking layer 440 is formed of aluminum, zirconia, zirconia, tungsten or the like.

As one example, the heat blocking layer 440 has an area that covers one or more pixels. In this way, by blocking the heat generated by the signal processing circuit 202 and the image processing circuit 302 with the heat blocking layer 440, the heat can be prevented to be transferred to the pixels (photoelectric converting unit 102).

In FIG. 15, the heat blocking layer 440 is provided in both of the first wiring layer 120 and the second wiring layer 220, but it is not limited thereto. The heat blocking layer 440 may be provided in either one of the first wiring layer 120 or the second wiring layer 220. Also, by using the heat blocking layer 440 and the heat conduction layer together, the heat can be prevented to be transferred to the pixels and at the same time can be effectively dissipated to the exterior.

Figure 16:
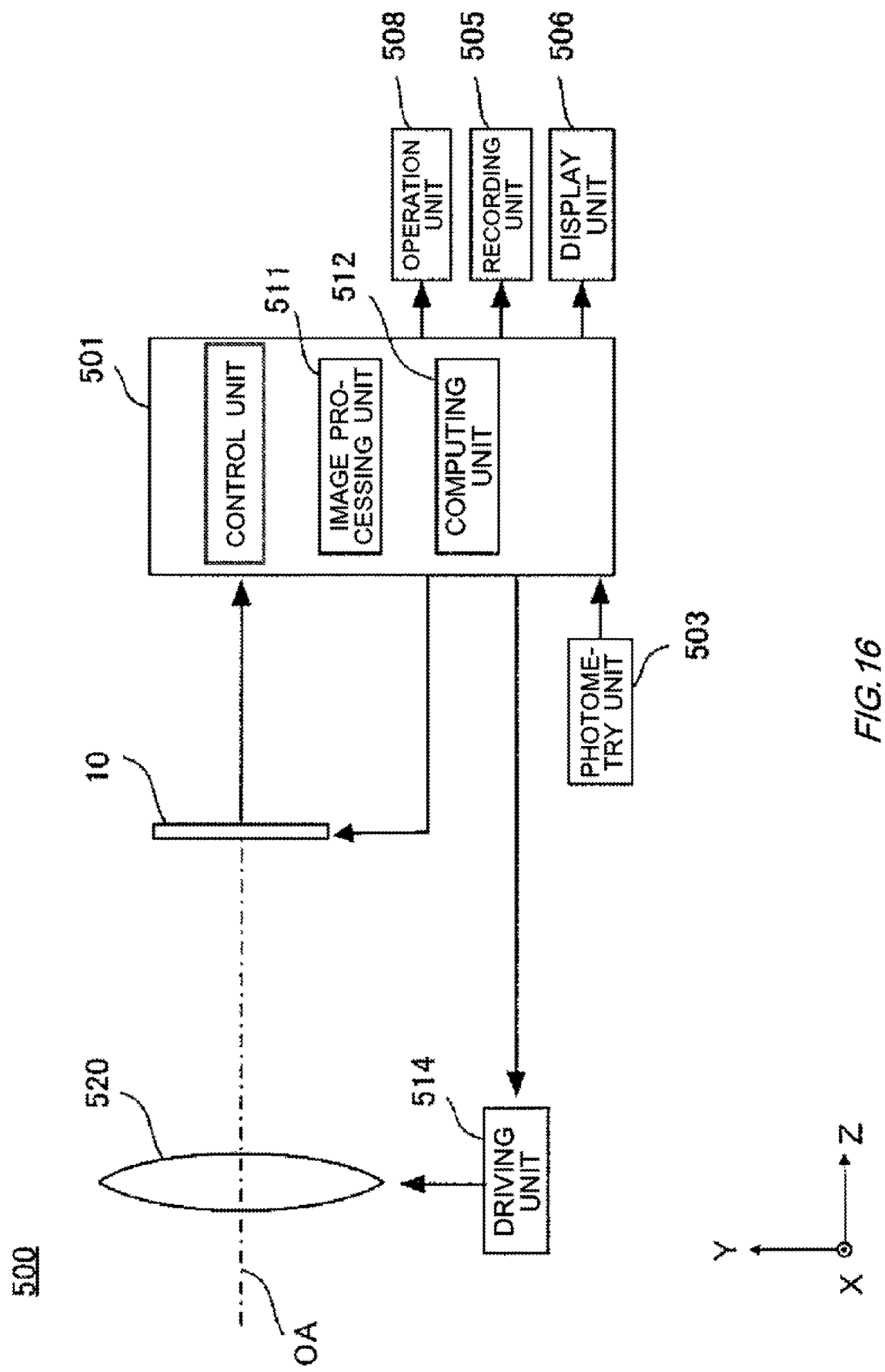
FIG. 16 illustrates a block diagram showing a configuration example of an image capturing apparatus 500 according to the present embodiment.

FIG. 16 illustrates a block diagram showing a configuration example of the image capturing apparatus 500 according to the present embodiment. The image capturing apparatus 500 includes an image capturing device 10, a control unit 501, a photometry unit 503, a recording unit 505, a display unit 506 and a driving unit 514. The imaging lens 520 directs light from the subject to the image capturing device 10 and forms the subject image on the image capturing device 10. It should be noted that the imaging lens 520 may be detachable from the image capturing apparatus 500.

The imaging lens 520 is configured by a plurality of optical lens groups including a focus adjustment lens (focus lens) and an aperture diaphragm to form an image of light from the subject in the vicinity of the focal surface. It should be noted that in FIG. 16, a single virtual lens arranged near the pupil of the imaging lens 520 is shown as representative.

The driving unit 514 moves the position of the imaging lens 520. More specifically, the driving unit 514 moves the optical lens group of the imaging lens 520 to change the focus position. Also, the aperture in the imaging lens 520 is driven to control the amount of light entering the image capturing device 10.

The image capturing device 10 is identical to the image capturing device 10 described regarding FIG. 1 to FIG. 15. The image capturing device 10 photoelectrically converts the receive light to produce a signal, and outputs the produced signal to the image processing unit 511 of the control unit 501. The image processing unit 511 performs various image processing on the signal output from the image capturing device 10 and produces still image data and and moving image data. For example, the image processing unit 511 performs image processing such as tone conversion processing, color interpolation processing, compression processing and so on.

The recording unit 505 is a recording medium such as a memory card. Image data, control programs and so on are recorded in the recording unit 505. The control unit 501 controls the writing of data into the recording unit 505 and the reading of data from the recording unit 505. The display unit 506 displays images based on the image data, information related to imaging capturing such as shutter speed, aperture value and so on, and menu screen and so on. An operation unit 508 includes various setting switches such as a release button, power supply switch, and switches for switching various modes, and outputs signals based on operations from the imager to the control unit 501.

The photometry unit 503 detects the luminance distribution of the subject or scene prior to a series of image capturing sequence that produces the image data. The photometry unit 503 includes a sensor of about 1 million pixels, for example. The computing unit 512 of the control unit 501 calculates the subject and luminance based on the output of the photometry unit 503.

The computing unit 512 determines the shutter speed, aperture value, and ISO sensitivity according to the calculated luminance distribution. The image capturing device 10 may double as the photometry unit 503. It should be noted that the computing unit 512 performs various types of computations for causing the image capturing apparatus 500 to operate. A part of the control unit 501 may be loaded on the image capturing device 10.

The control unit 501 is configured by a processor such as CPU, FPGA, ASIC or the like, and a memory such as ROM, RAM or the like, and controls each unit of the image capturing apparatus 500 based on a control program. For example, the control unit 501 supplies the image capturing device 10 with the signal that controls the image capturing device 10, and controls the operations of the image capturing device 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: image capturing device; 100: first layer; 101: microlens; 102: photoelectric converting unit; 103: passivation film; 104: color filter; 105: transistor; 106: TSV; 110: first substrate; 120: first wiring layer; 150: stacked surface; 160: stacked surface; 162: first region; 164: second region; 166: third region; 180: wires; 190: connection unit; 200: second layer; 202: signal processing circuit; 210: second substrate; 220: second wiring layer; 230: wiring layer; 300: third layer; 302: image processing circuit; 310: third substrate; 320: third wiring layer; 410: heat conduction layer; 412: first heat conduction layer; 414: second heat conduction layer; 420: first heat conduction board; 421: second heat conduction board; 422: coupling unit; 430: disconnection unit; 440: heat blocking layer; 450: heat dissipation layer; 460: heat conduction board; 470: concavo-convex region; 500: image capturing apparatus; 501: control unit; 503: photometry unit; 505: recording unit; 506: display unit; 508: operation unit; 511: image processing unit; 512: computing unit; 514: driving unit; 520: imaging lens

What is claimed is:

1. An image capturing device, comprising:
   a first layer, including a first substrate on which a photoelectric converting unit configured to convert light into electric charges is arranged;
   a second layer, stacked with the first layer and including a second substrate on which a first circuit configured to perform a first signal processing on a first signal is arranged, the first signal being based on the electric charges converted by the photoelectric converting unit; and
   a third layer, stacked with the first layer and including (a) a third substrate on which a second circuit configured to perform a second signal processing on a second signal is arranged, the second signal being a signal which is output from the first circuit and in which the first signal processing is performed on the first signal by the first circuit, and (b) a first member which is arranged between the second substrate and the third substrate in a first direction in which the first layer and the second layer are stacked, the first member being thermally conductive and extending along a second direction that intersects with the first direction, wherein
   the second layer is arranged between the first layer and the third layer in the first direction.

2. The image capturing device according to claim 1, wherein
   the third layer includes a second member that is thermally conductive, is arranged between the second substrate and the third substrate in the first direction, and extends along the second direction, and
   the second member is arranged alongside of the first member along the second direction.

3. The image capturing device according to claim 1, wherein
   the third layer includes a second member that is thermally conductive, is arranged between the second substrate and the third substrate in the first direction, and extends along the second direction, and
   the second member is arranged between the first member and the third substrate in the first direction.

4. The image capturing device according to claim 3, wherein a length of the first member in the first direction is longer than a length of the second member in the first direction.

5. The image capturing device according to claim 1, wherein the second layer is arranged between the second substrate and the third substrate in the first direction and includes a second member which is thermally conductive and extends along the second direction.

6. The image capturing device according to claim 5, wherein heat conductivity of the first member is higher than heat conductivity of the second member.

7. The image capturing device according to claim 6, wherein an area of the first member is greater than an area of the second member.

8. The image capturing device according to claim 6, further comprising a third member which is thermally conductive and arranged between the first member and the second member in the first direction.

9. The image capturing device according to claim 8, wherein the third member is connected to the first member.

10. The image capturing device according to claim 9, wherein the third member is connected to the second member.

11. The image capturing device according to claim 1, wherein the first member is arranged between the first circuit and the third substrate in the first direction.

12. The image capturing device according to claim 1, wherein the first member is formed of copper.

13. The image capturing device according to claim 1, further comprising a connection unit which electrically connects the first substrate and the second substrate and includes second members that are conductive and arranged facing each other in the first direction.

14. The image capturing device according to claim 13, wherein the second members are arranged between the photoelectric converting unit and the second substrate in the first direction.

15. The image capturing device according to claim 13, wherein the first signal is output from the first substrate to the first circuit via the second members.

16. The image capturing device according to claim 15, wherein the second members are formed of copper.

17. The image capturing device according to claim 1, wherein the second substrate is provided with a control circuit configured to control an accumulation time for accumulating the electric charges converted by the photoelectric converting unit.

18. An image capturing apparatus comprising the image capturing device according to claim 1.

19. The image capturing apparatus according to claim 18, further comprising a driving unit configured to drive an optical system that emits light toward the image capturing device.

20. The image capturing apparatus according to claim 18, further comprising an image processing unit electrically connected to the image capturing device and configured to produce image data.

* * * * *